(12) United States Patent
Larson, III et al.

(10) Patent No.: US 7,562,429 B2
(45) Date of Patent: Jul. 21, 2009

(54) SUSPENDED DEVICE AND METHOD OF MAKING

(75) Inventors: John D Larson, III, Palo Alto, CA (US); Stephen Ellis, Pleasanton, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 366 days.

(21) Appl. No.: 11/156,676

(22) Filed: Jun. 20, 2005

(65) Prior Publication Data

US 2006/0284707 A1    Dec. 21, 2006

(51) Int. Cl.
*H03H 3/02* (2006.01)
*H01L 41/22* (2006.01)
*H03H 9/15* (2006.01)

(52) U.S. Cl. .................. 29/25.35; 29/594; 333/187; 216/2; 216/13; 216/52; 310/324

(58) Field of Classification Search .......... 333/187, 333/189; 310/324, 349; 29/25.35, 594; 216/2, 216/13, 17, 52, 72
See application file for complete search history.

(56) References Cited

U.S. PATENT DOCUMENTS

| 3,422,371 | A |   | 1/1969 | Poirier et al. |   |
|---|---|---|---|---|---|
| 3,568,108 | A |   | 3/1971 | Poirier et al. |   |
| 6,262,637 | B1 |   | 7/2001 | Bradley et al. |   |
| 6,377,137 | B1 | * | 4/2002 | Ruby | 333/189 |
| 6,384,697 | B1 |   | 5/2002 | Ruby |   |
| 6,670,866 | B2 |   | 12/2003 | Ella et al. |   |
| 6,720,844 | B1 |   | 4/2004 | Lakin |   |
| 6,842,088 | B2 | * | 1/2005 | Yamada et al. | 333/187 |
| 7,053,456 | B2 | * | 5/2006 | Matsuo | 257/415 |

(Continued)

FOREIGN PATENT DOCUMENTS

EP    1 291 317    3/2003

(Continued)

OTHER PUBLICATIONS

Lakin K M: "Thin Film Resonator Technology" 2003 IEEE International Frequency Control Symoposium & PDA Exhibition Jointly With The 17th European Frequency and Time Forum, Tampa, FL, May 4, 2003-May 8, 2003 sections VI, VII IX; figures 5, 9, 13, 18 pp. 765-778.

(Continued)

*Primary Examiner*—Barbara Summons

(57) ABSTRACT

A substrate defining a cavity comprising a wide, shallow first portion and a narrow, deep second portion is provided. The first portion of the cavity extends into the substrate from the front side of the substrate and is filled with sacrificial material. The second portion extends deeper into the substrate from the first portion. A device structure is fabricated over the sacrificial material. A release etchant is introduced from the back side of the substrate via the second portion of the cavity to remove from the first portion of the cavity the sacrificial material underlying the device structure. Removing from the first portion of the cavity the sacrificial material underlying the device structure by introducing the release etchant from the back side of the substrate via the second portion of the cavity allows the release etch to be performed without exposing the device structure to the release etchant. This allows the device structure to incorporate materials that have a low etch selectivity with respect to the sacrificial material.

9 Claims, 14 Drawing Sheets

U.S. PATENT DOCUMENTS

| | | |
|---|---|---|
| 2002/0093038 A1 | 7/2002 | Ikeda et al. |
| 2005/0093653 A1 | 5/2005 | Larson, III |
| 2005/0093656 A1 | 5/2005 | Larson, III et al. |
| 2005/0110598 A1* | 5/2005 | Larson, III .................. 333/191 |
| 2005/0218488 A1 | 10/2005 | Matsuo |
| 2005/0218755 A1* | 10/2005 | Song et al. .................. 310/348 |
| 2005/0253670 A1* | 11/2005 | Song et al. .................. 333/187 |
| 2006/0202769 A1* | 9/2006 | Nagao et al. .................. 331/73 |

FOREIGN PATENT DOCUMENTS

| | | |
|---|---|---|
| EP | 1 528 675 | 5/2005 |
| EP | 1 585 218 | 10/2005 |
| EP | 1 598 933 | 11/2005 |
| EP | 1 598 934 | 11/2005 |
| EP | 1 684 420 | 7/2006 |
| JP | 2005-304021 | * 10/2005 |

OTHER PUBLICATIONS

Lakin et al., "Temperature Compensated Bulk Acoustic Thin Film Resonators," 2000 IEE Ultrasonics Symposium, pp. 855-858, Oct. 2000.

* cited by examiner

SUSPENDED DEVICE AND METHOD OF MAKING

BACKGROUND

FBAR devices that incorporate one or more film bulk acoustic resonators (FBARs) form part of an ever-widening variety of electronic products, especially wireless products. For example, modern cellular telephones incorporate a duplexer in which each of the band-pass filters includes a ladder circuit in which each element of the ladder circuit is an FBAR. A duplexer incorporating FBARs is disclosed by Bradley et al. in U.S. Pat. No. 6,262,637 entitled Duplexer Incorporating Thin-film Bulk Acoustic Resonators (FBARs), assigned to the assignee of this disclosure and incorporated by reference. Such duplexer is composed of a transmitter band-pass filter and a receiver band-pass filter. The transmitter band-pass filter is connected between the output of the transmitter and the antenna. The receiver band-pass filter is connected in series with 90° phase-shifter between the antenna and the input of the receiver. The center frequencies of the pass-bands of the transmitter band-pass filter and the receiver band-pass filter are offset from one another. Ladder filters based on FBARs are also used in other applications.

An FBAR is composed of opposed planar electrodes and a piezoelectric element between the electrodes. The FBAR is suspended over a cavity defined in a substrate, which allows the FBAR to resonate mechanically in response to an electrical signal applied between the electrodes.

U.S. patent application Ser. No. 10/699,289 of Larson III, assigned to the assignee of this disclosure and incorporated by reference, discloses a band-pass filter that incorporates a decoupled stacked bulk acoustic resonator (DSBAR). The DSBAR is composed of a lower FBAR, an upper FBAR stacked on lower FBAR and an acoustic decoupler between the FBARs. Each of the FBARs is structured as described above. An electrical input signal is applied between electrodes of the one of the FBARs and the other of the FBARs provides a band-pass filtered electrical output signal between its electrodes.

U.S. patent application Ser. No. 10/699,481 of Larson III et al., assigned to the assignee of this disclosure and incorporated by reference, discloses a film acoustically-coupled transformer (FACT) composed of two decoupled stacked bulk acoustic resonators (DSBARs). A first electrical circuit interconnects the lower FBARs of the DSBARs in series or in parallel. A second electrical circuit interconnects the upper FBARs of the DSBARs in series or in parallel. Balanced or unbalanced FACT embodiments having impedance transformation ratios of 1:1 or 1:4 can be obtained, depending on the configurations of the electrical circuits. Such FACTs also provide galvanic isolation between the first electrical circuit and the second electrical circuit.

FBARs and devices, such as ladder filters, DSBARs, FACTs and band-pass filters, incorporating one or more FBARs will be referred to generically in this disclosure as FBAR devices.

Most FBAR devices have a frequency response having a band pass characteristic characterized by a center frequency. The constituent FBARs have a frequency response characteristic characterized by a resonant frequency. In practical embodiments of current FBAR devices in which the material of the piezoelectric element is aluminum nitride (AlN) and the material of the electrodes is molybdenum (Mo), the resonant frequency of each FBAR has a temperature coefficient that ranges from about −20 ppm/° C. to about −35 ppm/° C. The temperature coefficient of the resonant frequency reduces the temperature range over which the FBAR device incorporating the FBAR can meet its pass bandwidth specification. The temperature coefficient of the resonant frequency additionally reduces manufacturing yield, because the pass bandwidth limits to which the FBAR devices are tested have to be inset from the pass bandwidth specification to ensure that the FBAR device will meet the pass bandwidth specification over its entire operating temperature range.

U.S. patent application Ser. No. 10/977,398 of Larson III et al., assigned to the assignee of this disclosure and incorporated by reference, discloses FBAR devices that incorporate a temperature compensating element that effectively reduces the temperature coefficient of the pass bandwidth of the FBAR device. However, the temperature compensating elements disclosed in the application are composed of materials not normally used in the semiconductor fabrication-based processes typically used to fabricate FBAR devices. The need to use unique processing to form the temperature-compensating element is economically disadvantageous.

In *Temperature Compensated Bulk Acoustic Thin Film Resonator*, 2000 IEE ULTRASONICS SYMPOSIUM, 855-858, Lakin et al. disclose that silicon dioxide ($SiO_2$) has a positive temperature coefficient in the temperature range 20° C.-80° C. The positive temperature coefficient of $SiO_2$ is opposite that of aluminum nitride and molybdenum, which are materials commonly used in FBARs. An $SiO_2$ temperature compensating element reduces the temperature coefficient of the resonant frequency of the FBAR to about one half of that of an uncompensated FBAR. Using $SiO_2$ as the material of the compensating element is attractive for the additional reason that $SiO_2$ deposition and patterning is a well-established, standard semiconductor fabrication process.

Lakin et al. disclose the use of $SiO_2$ in the context of a solidly-mounted resonator. However, suspended FBAR devices, in which a suspended FBAR stack comprising the FBAR(s) is suspended over a shallow cavity defined in a substrate, typically have better performance than solidly-mounted resonators. The suspended FBAR stack is typically fabricated on the surface of a support layer of sacrificial material, typically phosphosilicate glass (PSG), that fills the cavity. After the FBAR stack has been fabricated, a release etch is performed to remove the sacrificial material from under the FBAR stack. This leaves the FBAR stack suspended over the cavity. The release etch typically uses dilute hydrofluoric acid (HF). However, HF additionally aggressively attacks $SiO_2$. Accordingly, a temperature compensating element composed of a layer of $SiO_2$ is incompatible with the release etch performed after the FBAR stack has been fabricated. What is needed, therefore, is a way of fabricating a suspended FBAR device in which the FBAR stack comprises a material, such as $SiO_2$, that is incompatible with the release etch performed after the suspended FBAR stack has been fabricated.

Many other types of suspended devices, in which a suspended device structure is suspended over a shallow cavity, are fabricated on a support layer that is removed from under the device structure in a release etch performed after the device structure has been fabricated. Performing the release etch after the device structure has been fabricated limits the materials that can be used in the device structure to those that are compatible with the release etchant. This limitation can be problematical. What is additionally needed, therefore, is a way of fabricating a suspended device in which the device structure comprises a material that is incompatible with the release etchant.

SUMMARY OF THE INVENTION

In a first aspect, the invention provides a film bulk acoustic resonator (FBAR) device that comprises a substrate and a cavity defined in the substrate and extending into the substrate from the front side of the substrate. The FBAR device additionally comprises an FBAR stack suspended over the cavity, and a hole defined in the substrate and extending through the substrate from the back side of the substrate to the cavity.

In a second aspect, the invention provides a device comprising a substrate, a cavity defined in the substrate and a device structure suspended over the cavity. The cavity comprises a wide, shallow first portion and a narrow, deep second portion. The first portion extends into the substrate from the front side of the substrate. The second portion extends through the substrate from the back side of the substrate to the first portion.

In a third aspect, the invention provides a method of making a suspended device. In the method, a substrate defining a cavity comprising a wide, shallow first portion and a narrow, deep second portion is provided. The first portion of the cavity extends into the substrate from the front side of the substrate and is filled with sacrificial material. The second portion extends deeper into the substrate from the first portion. A device structure is fabricated over the sacrificial material. A release etchant is introduced from the back side of the substrate via the second portion of the cavity to remove from the first portion of the cavity the sacrificial material underlying the device structure.

Removing from the first portion of the cavity the sacrificial material underlying the device structure by introducing a release etchant from the back side of the substrate via the second portion of the cavity allows the release etch to be performed without exposing the device structure to the release etchant. This allows the device structure to incorporate materials that are incompatible with the release etchant. For example, this allows a suspended FBAR device to be made in which the sacrificial material is PSG and the suspended FBAR stack incorporates a silicon dioxide temperature compensating element.

DETAILED DESCRIPTION

Figure 1A:
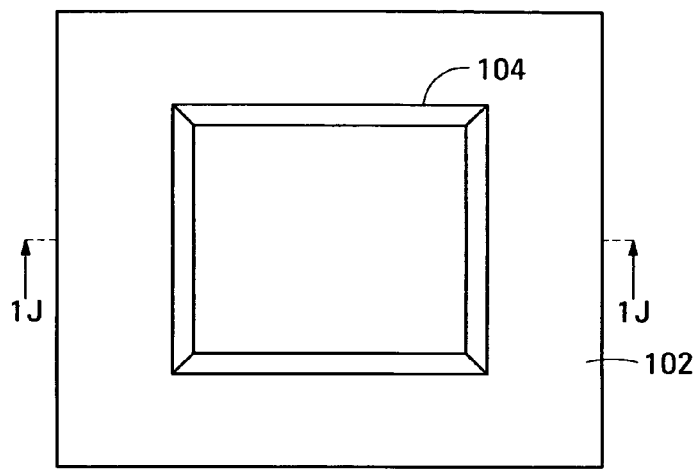
FIGS. 1A-1I are plan views illustrating an example of a process in accordance with the invention for making a first embodiment of a suspended device in accordance with the invention.

Embodiments of the invention will be described with reference to embodiments of suspended FBAR devices as examples of suspended devices. Other examples of suspended devices in accordance with the invention have device structures different from a FBAR stack suspended over a cavity.

A suspended FBAR device comprises a suspended FBAR stack. As used in this disclosure, the term FBAR stack refers to a stack of layers of various materials in which one or more film bulk acoustic resonators (FBARs) is defined. In embodiments in which more than one FBAR is defined in the FBAR stack, the FBARs may be located at the same level in the FBAR stack or may be located at different levels in the FBAR stack, or some of the FBARs may be located at the same level in the FBAR stack and some of the FBARs may be located at different levels in the FBAR stack. For example, in an FBAR ladder filter, the FBARs are typically at the same level in the FBAR stack, as will be described below with reference to FIGS. 3A-3C. In a decoupled stacked bulk acoustic resonator (DSBAR), the FBARs are at different levels in the FBAR stack, as will be described below with reference to FIGS. 4A and 4B. In a thin-film acoustically-coupled transformer (FACT), some of the FBARs of are at the same level in the FBAR stack and some of the FBARs are at different levels in the FBAR stack, as will be described below with reference to FIGS. 5A-5C.

An FBAR has a resonant frequency that depends directly on the velocity of propagation of sound in the FBAR and that depends inversely on the thicknesses of the layers constituting the FBAR. The velocity of propagation in most of the materials from which FBARs are currently fabricated exhibits a negative temperature coefficient because the inter-atomic forces weaken with increasing temperature. A decrease in these forces results in a decrease in the elastic constant of the material with a concomitant decrease in the velocity of propagation. An increase in temperature causes the velocity of propagation to decrease, and also causes the layers to increase in thickness. Both of these effects tend to reduce the resonant frequency of the FBAR, resulting in the above-described negative temperature coefficient. For example, the temperature coefficients of aluminum nitride (AlN) and molybdenum (Mo) from which FBARs are currently fabricated are about $-25$ ppm/° C. and $-60$ ppm/° C., respectively.

The relationship between the temperature coefficient of the resonant frequency of the FBAR and the temperature coefficients of the electrodes and piezoelectric element of the FBAR is determined by the relative thicknesses of the electrodes and the piezoelectric element. An FBAR-based duplexer has a receiver ladder filter in which the FBARs typically have relatively thin electrodes and a relatively thick piezoelectric element. The resonant frequency of such FBARs has a temperature coefficient similar to that of AlN, i.e., about −25 ppm/° C. The transmitter ladder filter of the FBAR-based duplexer typically has FBARs with relatively thick electrodes and a relatively thin piezoelectric element. The temperature coefficient of the molybdenum of the electrodes provides a greater contribution to the temperature coefficient of the resonant frequency of the FBAR than in the receiver ladder filter. Consequently, the resonant frequency of the FBARs in the transmitter ladder filter has a temperature coefficient in a range from about −35 ppm/° C. to about −40 ppm/° C.

In accordance with the invention, the suspended FBAR stack is suspended over a cavity defined in a substrate and additionally incorporates an etch-incompatible material that is incompatible with the release etchant used to remove the sacrificial material from under the FBAR stack after the FBAR stack has been fabricated. In several embodiments, a layer of the etch-incompatible material constitutes a temperature-compensating element that reduces the temperature coefficient of the resonant frequency of the FBARs defined in the FBAR stack. The temperature-compensating element has a temperature coefficient opposite in sign to the piezoelectric element that is part of the FBAR stack, i.e., the temperature-compensating element has a positive temperature coefficient in the above example in which the piezoelectric element has a negative temperature coefficient. With the temperature-compensating element, the effective temperature coefficient $TC_{eff}$ of each FBAR becomes, to a first approximation:

$$TC_{eff} = \{(TC_E * t_E) + (TC_P * t_P) + (TC_C * t_C)\}/(t_E + t_P + t_C) \quad (1)$$

where $TC_E$ is the temperature coefficient of the electrode material, $TC_P$ is the temperature coefficient of the material of the piezoelectric element, $TC_C$ is the temperature coefficient of temperature-compensating element, $t_E$ is the total thickness of the electrodes, $t_P$ is the thickness of the piezoelectric element and $t_C$ is the total thickness of the temperature-compensating element. The thicknesses are measured in the direction in which sound propagates through the elements during operation of the FBAR device. Equation (1) applies to both the longitudinal and shear modes of propagation. Equation (1) ignores the second order effect of the acoustic impedances of the electrodes, piezoelectric element and temperature-compensating element on the temperature compensating effect of the temperature-compensating element.

As noted above, a layer of silicon dioxide ($SiO_2$) located in or adjacent the FBAR stack forms an effective temperature-compensating element. However $SiO_2$ has a low etch selectivity with respect to PSG, a commonly-used and well-understood sacrificial material.

Embodiments of a method in accordance with the invention form suspended FBAR devices in which the suspended FBAR stack incorporates an $SiO_2$ temperature-compensating element and is fabricated on PSG sacrificial material. The release etch is performed using dilute HF after the FBAR stack has have been fabricated. Embodiments of a method in accordance with other embodiments of the invention form device structures on sacrificial material. The release etch is performed after the device structures have been fabricated using a release etchant that is incompatible with one or more of the materials of the device structures.

Such embodiments are applied to a wafer-scale fabrication process used to fabricate thousands of temperature-compensated suspended FBAR devices at the same time. Such wafer-scale fabrication makes the temperature-compensated suspended FBAR devices inexpensive to fabricate. For the sake of simplicity, an exemplary embodiment of the method used to fabricate an embodiment of a suspended temperature-compensated FBAR device in which a single temperature-compensated FBAR is defined in the FBAR stack will be described with reference to the plan views shown in FIGS. 1A-1I and the cross-sectional views shown in FIGS. 1J-1R.

The method includes a device-fabrication process in which, in this example, an FBAR stack in which a single FBAR is defined is fabricated. Other types of suspended FBAR device in which the FBAR stack comprises a material that is incompatible with the release etchant may be fabricated in the device fabricating process simply by using the appropriate FBAR stack fabrication process. Similarly, other suspended devices in which the device structure comprises material that is incompatible with the release etchant may be fabricated simply by using the appropriate device structure fabrication process.

In the method, a wafer (not shown in its entirety) is provided. A portion of the wafer constitutes, for each FBAR device being fabricated, a substrate corresponding to the substrate 102 of the FBAR device whose fabrication is shown in the Figures. FIGS. 1A-1I and FIGS. 1J-1R illustrate and, the following description describes, the fabrication of the FBAR device in and on a portion of the wafer that constitutes substrate 102. As the FBAR device is fabricated, the remaining FBAR devices on the wafer are similarly fabricated.

In an example, the wafer was a commercially-available wafer of single-crystal silicon with a diameter of about 150 mm and a thickness of about 600 μm. Other wafer material may alternatively be used.

Figure 1J:
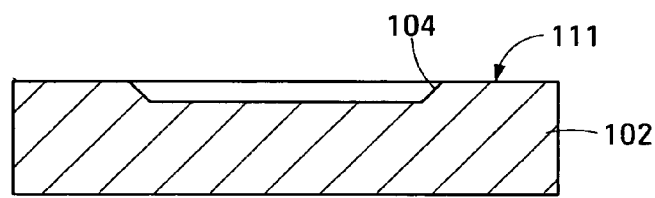
FIGS. 1J-1R are cross-sectional views along the section lines 1J-1J, 1K-1K, 1L-1L, 1M-1M, 1N-1N, 1O-1O, 1P-1P, 1Q-1Q and 1R-1R in FIGS. 1A-1I, respectively.

A wide, shallow cavity is formed extending into the wafer from the front side of the wafer at the location of each FBAR device on the wafer. FIGS. 1A and 1J show a wide, shallow cavity 104 extending into substrate 102 from the front side 111 of the substrate.

In an example in which the FBAR device is structured to operate at a frequency of about 2 GHz, the lateral dimensions of cavity 104 are about 100 μm square and about 4 μm deep, i.e., the lateral dimensions are each greater than the depth by at least one order of magnitude. In an example in which the material of the wafer is silicon, the cavities are formed by performing a selective dry etch using a mixture of sulfur hexafluoride ($SH_6$), hydrogen ($H_2$) and oxygen ($O_2$) as the etchant.

Figure 1B:
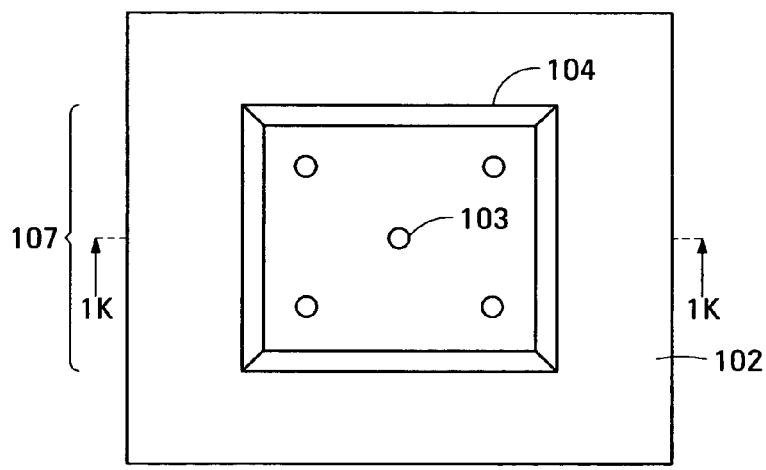
Figure 1K:
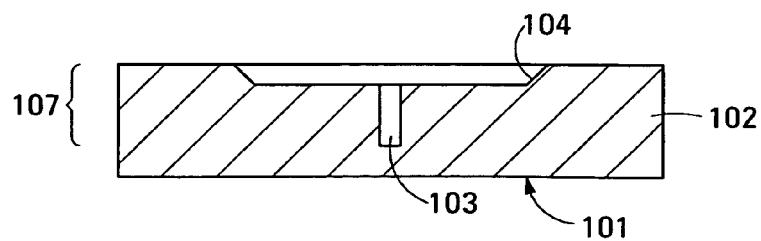

Deep, narrow etchant access holes are then formed in the wafer extending deeper into the wafer from each cavity. The etchant access holes are deep and narrow compared to the depth and width, respectively, of cavity 104. FIGS. 1B and 1K show etchant access holes extending deeper into substrate 102 from cavity 104. An exemplary one of the etchant access holes is shown at 103. Reference numeral 103 will additionally be used to refer to the etchant access holes collectively.

Etchant access holes 103 may extend all the way though substrate 102 from cavity 104 to the back side 101 of substrate 102. However, since the wafer of which substrate 102 forms part is later subject to a thickness-reducing process prior to being singulated into individual FBAR devices, as will be described below with reference to FIGS. 1F and 1O, etchant access holes 103 need extend no further into substrate 102 than the final thickness of the wafer.

The lateral dimensions of the etchant access holes 103 are typically in the range from about 5 μm to about 20 μm. More will be said about the lateral dimensions of the etchant access holes 103 below with reference to FIGS. 1C and 1L. The lateral dimensions of the etch access holes 103 are substantially less than the lateral dimensions of cavity 104. Round etchant access holes 103 are shown, but the etchant access holes may be of any other low aspect ratio shape. Five etchant access holes 103 are shown, but the number of etchant access holes may be greater than or less than this.

Cavity 104 can be regarded as constituting a wide, shallow first portion and etchant access holes 103 can collectively be regarded as constituting a narrow, deep second portion of a cavity 107 defined in substrate 102.

In an example, the final thickness to which the thickness of the wafer of which substrate 102 forms part is reduced is about 150 μm. In this example, etchant access holes 103 extend at least 150 μm into substrate 102 and have a diameter of about 12 μm. Etchant access holes 103 were formed by an isotropic etch process known as Deep Silicon Etch. Deep Silicon Etch is known in the art and is commercially available from several vendors. This process will therefore not be described here.

The order in which cavity 104 and etchant access holes 103 are formed may be the opposite of that just described.

Figure 1C:
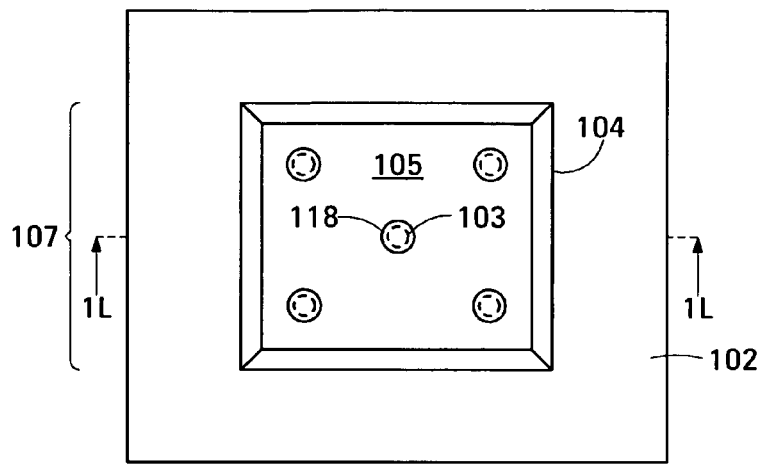
Figure 1L:
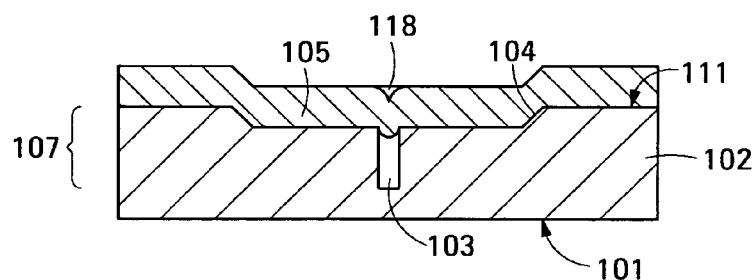

Sacrificial material is deposited on the surface of the wafer. FIGS. 1C and 1L show sacrificial material 105 deposited on the front side 111 of substrate 102. As deposited, sacrificial material 105 approximately follows the contours of the underlying surface of substrate 102 and cavity 104 and additionally extends part-way into etchant access holes 103. The sacrificial material extending into etchant access holes 103 forms corresponding indentations in the surface of the sacrificial material. The indentation formed by sacrificial material 105 extending into etchant access hole 103 is shown at 118. Reference numeral 118 will additionally be used to refer to the indentations collectively. Sacrificial material 105 is deposited with a thickness such that the bottom of the deepest one of indentations 118 is further from the back side 101 of substrate 102 than the front side 111 of substrate 102 is from the back side.

In an example, sacrificial material 105 was phosphosilicate glass (PSG) deposited using conventional low-pressure chemical vapor deposition (LPCVD). Other sacrificial materials may be used. The sacrificial material may alternatively be deposited by sputtering, by spin coating or by another suitable process.

Figure 1D:
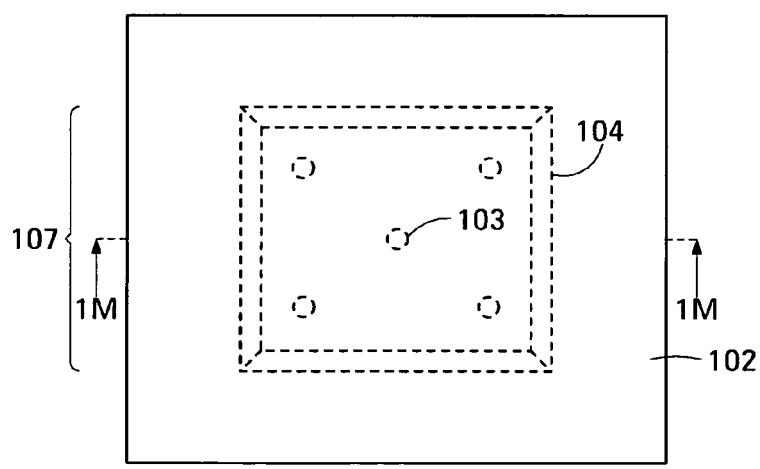
Figure 1M:
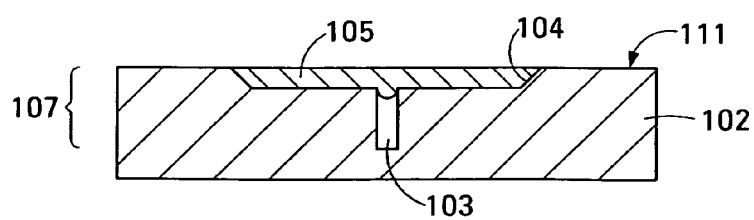

The surface of the wafer is then planarized, leaving each cavity filled with sacrificial material. FIGS. 1D and 1M show the result of the planarizing process: cavity 104 in substrate 102 is filled with sacrificial material 105, and sacrificial material 105 has a smooth, planar surface. The quality of the surface of sacrificial material 105 has a significant effect on the quality of the FBAR stack later fabricated on this surface. Depositing the sacrificial material as described above such that the bottoms of indentations 118 (FIG. 1L) are further from the back side 101 of substrate 102 than the front side 111 of substrate 102 is from the back side ensures that no traces of indentations 118 remain in sacrificial material 105 after the sacrificial material has been planarized flush with the top side 111 of substrate 102.

The depth of the indentations 118 (FIG. 1L) in the surface of sacrificial material 105 and the rate at which a release etchant later introduced via etchant access holes 103 removes sacrificial material 105 from under the fabricated FBAR stack (not shown) are determined by the lateral dimensions of etchant access holes 103. The larger the lateral dimensions of the etchant access holes, the faster the etchant removes the sacrificial material. However, the larger the lateral dimensions of the etchant access holes, the deeper the indentations and, hence, the greater the thickness of the sacrificial material that needs to be deposited to ensure that the bottoms of the indentations are further from the back side 101 of substrate 102 than front side 111 is from the back side. The greater the thickness of sacrificial material deposited, the longer the time needed to planarize the surface of the wafer. The lateral dimensions of the etchant access holes are therefore a compromise between the time needed to remove sacrificial material 105 by an etchant introduced through etchant access holes 103 and the time needed to planarize the surface of the wafer. Lateral dimensions in the range disclosed above give a reasonable compromise between etching time and planarizing time.

In an embodiment, the wafer was planarized using chemical-mechanical polishing (CMP), which is known in the art. Other suitable planarizing processes are known and may be used.

Figure 1E:
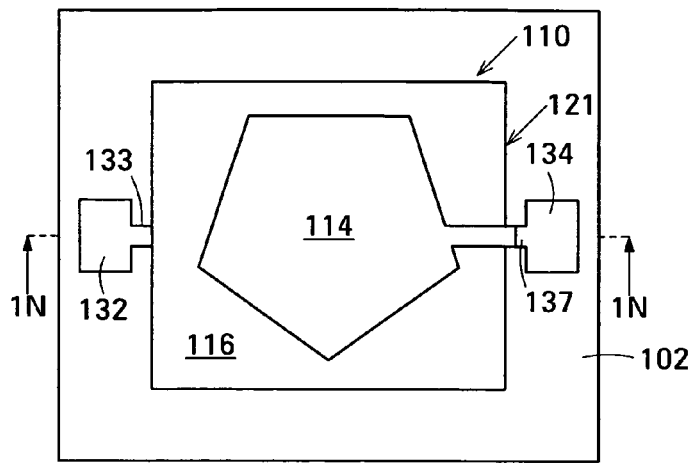
Figure 1N:
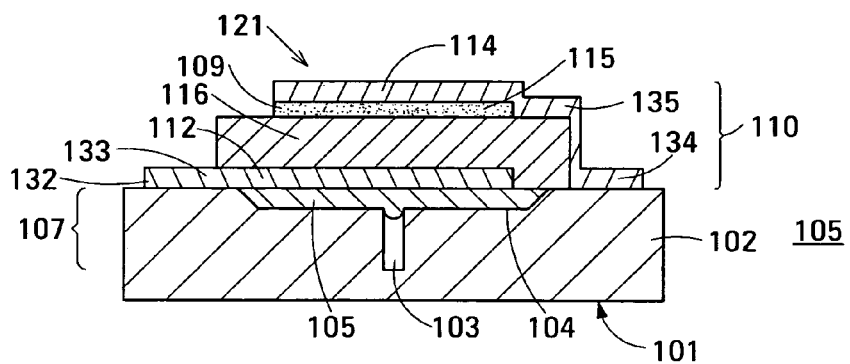

FBAR stacks comprising a material that has a low etch selectivity with respect to the sacrificial material, i.e., a material that is incompatible with the release etchant, are then fabricated on the surface of the wafer. Specifically, an FBAR stack comprising such incompatible material is fabricated on the surface of the sacrificial material filling each of the cavities defined in the wafer. FIGS. 1E and 1N show an FBAR stack 121 fabricated on the surface of sacrificial material 105 filling cavity 104 in substrate 102. In the example shown, a single temperature-compensated FBAR 110 is defined in FBAR stack 121.

FBAR 110 is composed of opposed planar electrodes 112 and 114 and a piezoelectric element 116 between the electrodes. Electrode 112 and part of piezoelectric element 116 are located on the surface of sacrificial material 105. Additionally located between electrodes 112 and 114 is temperature-compensating element 109. Temperature-compensating element 109 is composed of a layer 115 of temperature-compensating material of a thickness that significantly reduces the temperature coefficient of the resonant frequency of FBAR 110. In the example shown, temperature-compensating element 109 is located between piezoelectric element 116 and electrode 114 and the temperature-compensating material of layer 115 is silicon dioxide $SiO_2$. $SiO_2$ has a low etch selectivity with respect to sacrificial material 105. Fabrication of an exemplary FBAR stack will be described in further detail below with reference to FIGS. 7A-7J and 7K-7T.

Figure 1F:
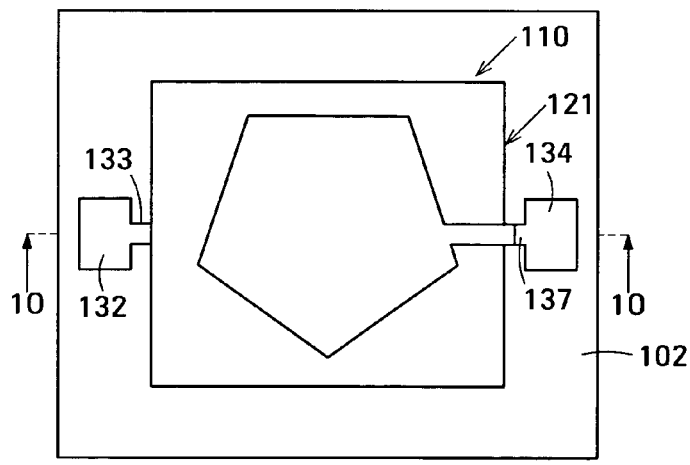
Figure 1O:
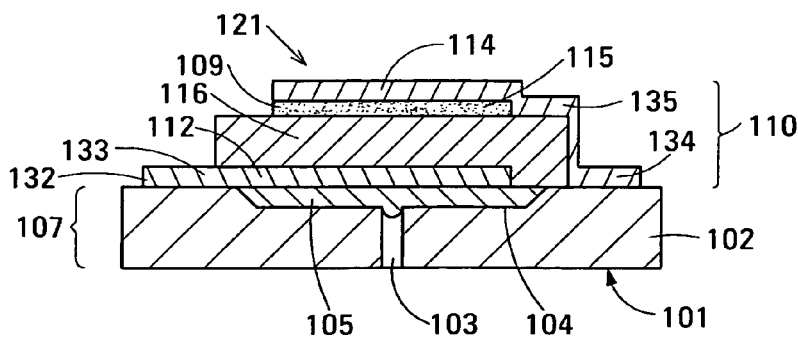

After FBAR stack 121 has been fabricated, the wafer of which substrate 102 forms part is subject to a thickness-reducing process to reduce its thickness to a thickness suitable for singulation. The thickness-reducing process additionally exposes the ends of the etchant access holes at the back side of the wafer. FIGS. 1F and 1O show substrate 102 after it has been subject to a thickness-reducing process that removes material from the back side 101 of substrate 102. The thickness-reducing process removes sufficient material from the back side 101 of substrate 102 that the ends of etchant access holes 103 remote from cavity 104 are exposed at the back side 101 of substrate 102.

In an example, lapping and polishing are used as the thickness-reducing process to reduce the overall thickness of the wafer of which substrate 102 forms part from about 600 μm to about 150 μm. The thickness-reducing process additionally exposes the ends of etchant access holes 103 at the back side 101 of substrate 102.

Figure 1G:
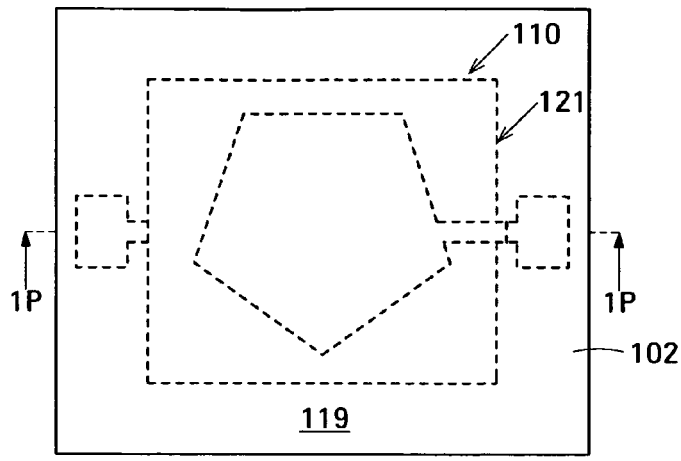
Figure 1P:
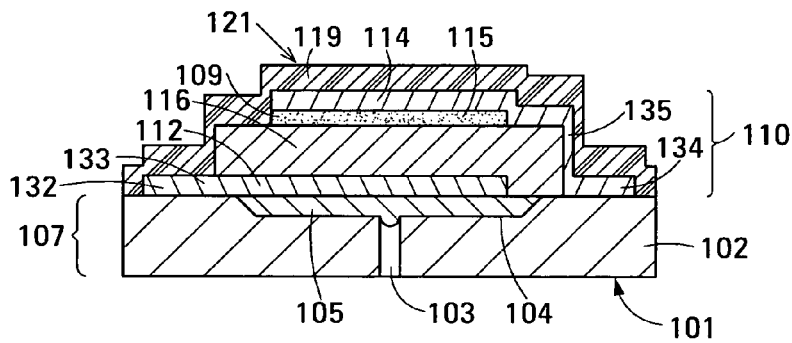

The front side of the wafer on which the FBAR stacks have been fabricated is then protected from the release etchant that will be used in the release etch that removes the sacrificial material from under the FBAR stacks. The back side of the wafer is left exposed. FIGS. 1G and 1P show FBAR stack 121 and the exposed parts of the front side of substrate 102 covered with a protective layer 119 of a material that is compatible with the constituent materials of FBAR stack 121 and that is additionally compatible with the release etchant. The wafer is baked after the material of protective layer 119 is applied.

In an example, the material of protective layer 119 is a photoresist spun onto the wafer of which substrate 102 forms a part. In another example, the material of protective layer 119 is made from precursor solutions containing oligomers that polymerize to form respective crosslinked polyphenylene polymers and is sold by The Dow Chemical Company, Midland, Mich., under the trademark SiLK. The precursor solutions are applied by spin coating. The wafer is baked after the material of protective layer 119 is applied.

An alternative way of protecting the FBAR stacks fabricated on the front side of the wafer will be described below with reference to FIG. 2.

Figure 1H:
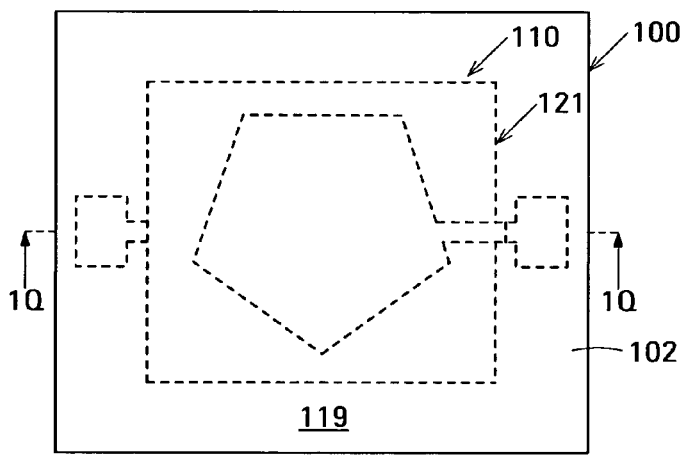
Figure 1Q:
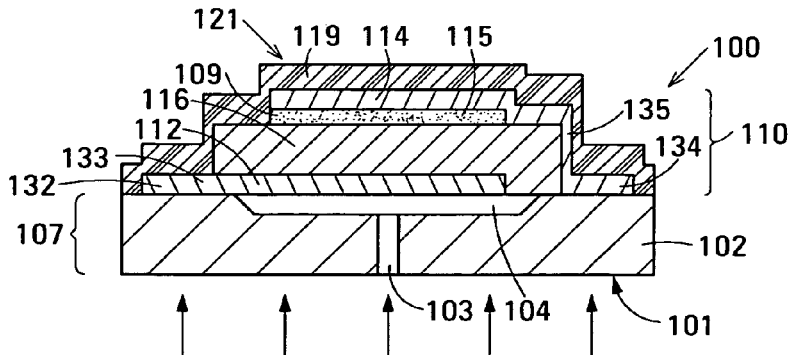

The wafer is then exposed to the release etchant. The release etchant is applied to the back side of the wafer and makes contact with the sacrificial material in the cavity via the etchant access holes. The release etchant dissolves the sacrificial material, leaving the FBAR stacks suspended over their respective cavities. FIGS. 1H and 1Q show FBAR stack 121 suspended over cavity 104 from which sacrificial material 105 (FIG. 1P) has been removed by a release etchant (represented by arrows) applied to the back side 101 of substrate 102 and passing into cavity 104 via etchant access holes 103.

In an example, the release etchant was hydrofluoric acid (HF). HF etches the PSG sacrificial material 105, and would additionally vigorously attack the silicon dioxide of temperature-compensating element 109. However, temperature-compensating element 109 is isolated from the release etchant by protective layer 119, electrode 112 and piezoelectric element 116. Thus, the release etchant removes sacrificial material 105, but temperature-compensating element 109 remains in place.

Figure 1I:
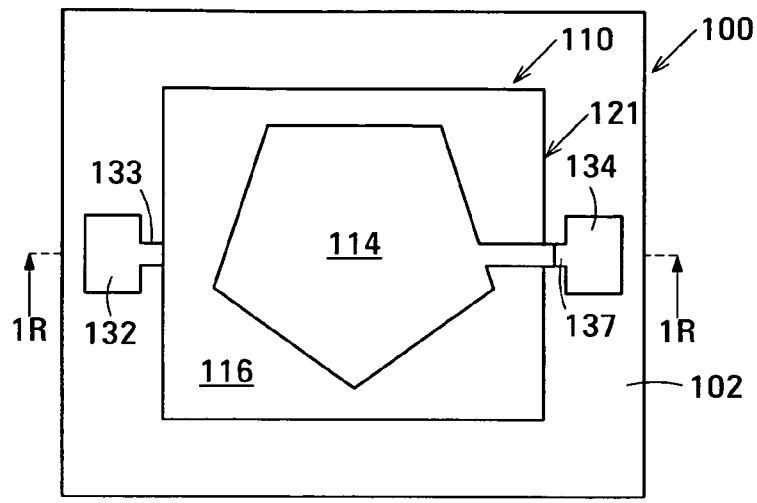
Figure 1R:
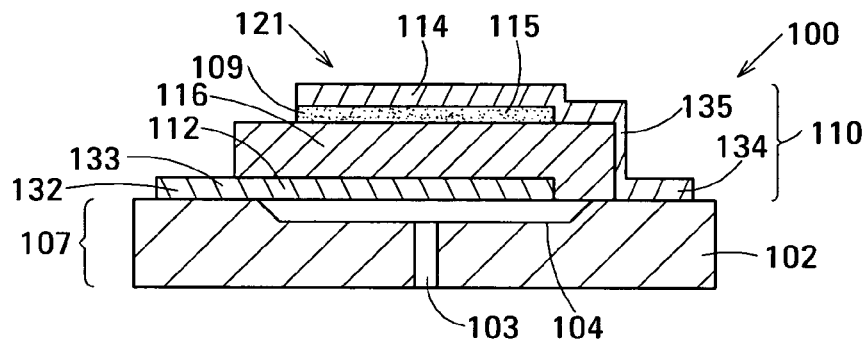

The protective layer is then stripped off the wafer to expose the FBAR stacks suspended over their respective cavities. The wafer is then singulated into individual FBAR devices. FIGS. 1I and 1R show FBAR device 100 after protective layer 119 (FIG. 1Q) has been removed and the wafer singulated into individual FBAR devices. In FBAR device 100, FBAR stack 121 is suspended over cavity 104 in substrate 102. Optionally, etchant access holes 103 may be plugged by a suitable material (not shown) before FBAR device 100 is packaged. Alternatively, packaging FBAR device 100 may effectively isolate cavity 104 and the undersides of electrode 112 and piezoelectric layer 116 from the environment.

Solvents that remove such protective materials as photoresist and crosslinked polyphenylene polymers are known in the art and may be used to remove protective layer 119. Techniques of singulating wafers of silicon and other substrate materials are known in the art and may be used.

Figure 2:
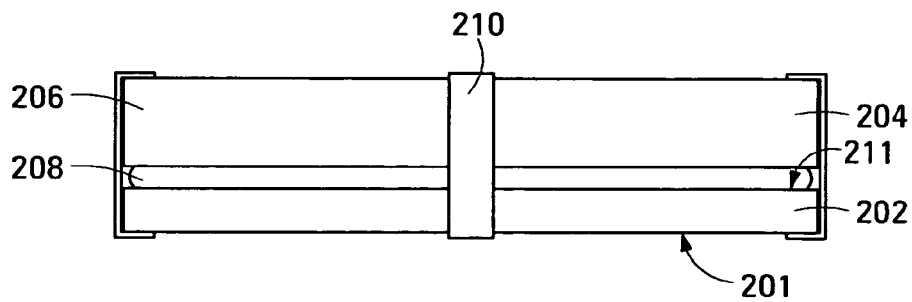
FIG. 2 is a side view illustrating an alternative way of protecting the device structures from the release etchant.

FIG. 2 illustrates an alternative way of protecting FBAR stack 121 (FIG. 1R) during the release etch described above with reference to FIGS. 1H and 1Q. After the thickness-reducing process described above with reference to FIGS. 1F and 1N has been performed, the front side 211 of the wafer 202 of which substrate 102 (FIG. 1R) forms part is protected from the release etchant by a protective element 204. In the example shown, protective element 204 is embodied as a silicon wafer 206 of the same diameter as wafer 202 and of conventional thickness. Disposed between wafer 206 and the front side 211 of wafer 202 is an O-ring 208. O-ring 208 serves two purposes: it spaces the front side of wafer 202 from wafer 206 to prevent the FBAR stacks (not shown) fabricated on the front side 211 of wafer 202 from being damaged by contact with wafer 206. Additionally, O-ring 208 provides a fluid-tight seal between wafers 202 and 206 to prevent the release etchant applied to the back side 201 of wafer 202 from contacting the FBAR stacks except via etchant access holes 103 (FIG. 1Q). Clamps, an exemplary one of which is indicated at 210, hold the stack composed of wafer 202, O-ring 208 and wafer 206 together and apply a force to wafers 202 and 206 that causes O-ring 208 to deform slightly to cause the O-ring to make intimate contact with the opposed surfaces of the wafers and thus provide the fluid-tight seal. For additional protection of the FBAR stacks during the release etch, protective layer 119 described above with reference to FIGS. 1G and 1P may be used in addition to the protective arrangement shown in FIG. 2.

Figure 3A:
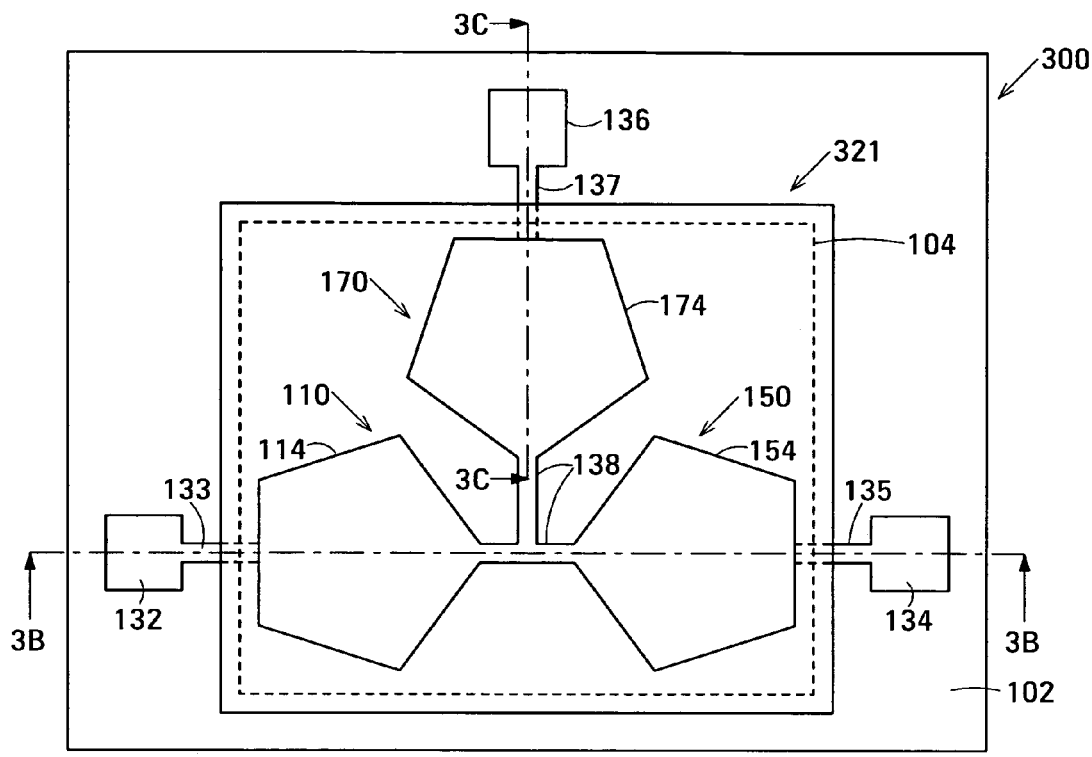
FIG. 3A is a plan view of a second embodiment of a suspended device in accordance with the invention.
Figure 3B:
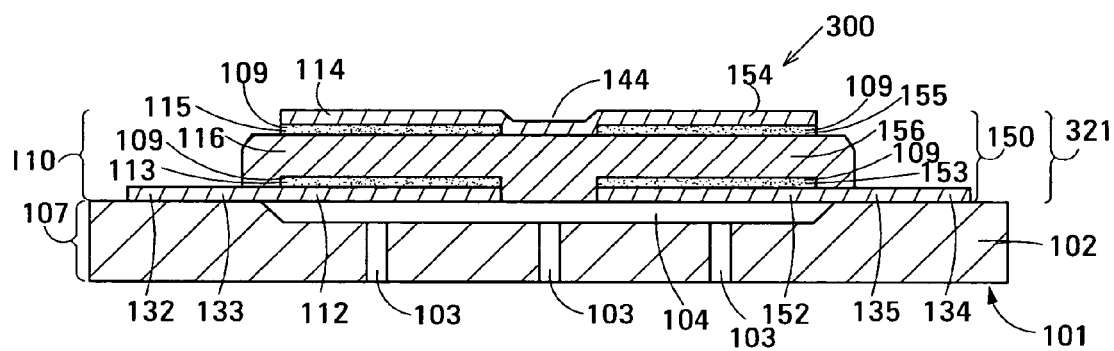
FIGS. 3B and 3C are cross-sectional views along section lines 3B-3B and 3C-3C, respectively, in FIG. 3A.
Figure 3C:
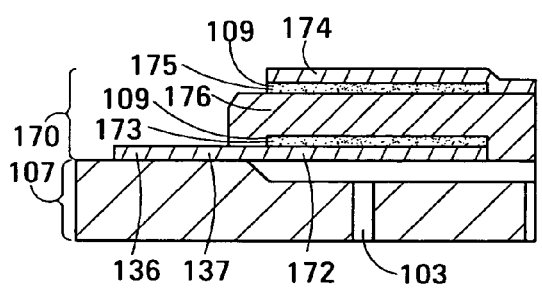
Figure 3D:
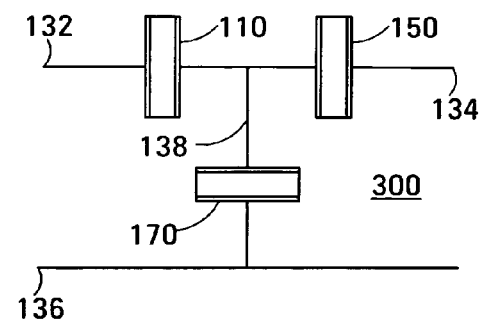
FIG. 3D is a schematic drawing of the electrical connections in the embodiment of the suspended device shown in FIG. 3A.

FIGS. 3A, 3B and 3C are respectively a plan view, a first cross-sectional view and a second cross-sectional view of a second embodiment of a suspended device in accordance with the invention. This embodiment of the suspended device is exemplified as a suspended FBAR device 300 in which three temperature-compensated FBARs 110, 150 and 170 interconnected to form an FBAR ladder filter are defined in a suspended FBAR stack 321. FBAR stack 321 is suspended over cavity 104 defined in substrate 102. Etchant access holes 103 extend from the back side 101 of substrate 102 to cavity 104. Cavity 104 and etchant access holes 103 can be regarded as being a first portion and a second portion, respectively, of cavity 107. FIG. 3D is a schematic drawing of FBAR device 300. Other embodiments of FBAR device 300 constitute more than the three FBARs shown.

In suspended FBAR device 300, suspended FBAR stack 321 comprises FBARs 110, 150 and 170 and a temperature-compensating element 109. FBAR 110 has opposed planar electrodes 112 and 114 and a piezoelectric element 116 between the electrodes. Piezoelectric element 116 has a temperature coefficient on which the temperature coefficient of the resonant frequency of FBAR 110 depends at least in part. The temperature coefficient of the resonant frequency of FBAR 110 typically additionally depends on the temperature coefficient of electrodes 112 and 114. Temperature-compensating element 109 has a temperature coefficient opposite in sign to the temperature coefficient of piezoelectric element 116. As a result of the opposite sign of its temperature coefficient, temperature-compensating element 109 reduces the effect of the temperature coefficient of piezoelectric element 116 on the temperature coefficient of the resonant frequency of FBAR 110.

FBAR 150 has opposed planar electrodes 152 and 154 and a piezoelectric element 156 between the electrodes. Piezoelectric element 156 has a temperature coefficient on which the temperature coefficient of the resonant frequency of FBAR 150 depends at least in part. The temperature coefficient of the resonant frequency of FBAR 150 typically additionally depends on the temperature coefficient of electrodes 152 and 154. Temperature-compensating element 109 reduces the effect of the temperature coefficient of piezoelectric element 156 on the temperature coefficient of the resonant frequency of FBAR 150 in a manner similar to that described above.

Referring additionally to FIG. 3C, FBAR 170 has opposed planar electrodes 172 and 174 and a piezoelectric element 176 between the electrodes. Piezoelectric element 176 has a temperature coefficient on which the temperature coefficient of the resonant frequency of FBAR 170 depends at least in part. The temperature coefficient of the resonant frequency of FBAR 170 typically additionally depends on the temperature coefficient of electrodes 172 and 174. Temperature-compensating element 109 reduces the effect of the temperature coefficient of piezoelectric element 176 on the temperature coefficient of the resonant frequency of FBAR 170 in a manner similar to that described above.

As a result of the temperature-compensating element 109 reducing the temperature coefficients of the resonant frequencies of the FBARs 110, 150 and 170, the temperature coefficient of the pass bandwidth of suspended FBAR device 300 is less than that of a similar FBAR device without temperature-compensating element 109.

Electrode 112 of FBAR 110 is electrically connected to an input terminal pad 132 by a trace 133 that extends in part under piezoelectric element 116 and in part over substrate 102. Electrode 152 of FBAR 150 is electrically connected to an output terminal pad 134 by a trace 135 that extends in part under piezoelectric element 156 and in part over substrate 102. Electrode 172 of FBAR 170 is electrically connected to a common terminal pad 136 by a trace 137 that extends in part under piezoelectric element 176 and in part over substrate 102. Electrodes 114, 154 and 174 of FBARs 110, 150 and 170 are electrically interconnected by a trace 138.

In the example shown in FIG. 3B, in FBAR 110, temperature-compensating element 109 is composed of a temperature-compensating layer 113 located between electrode 112 and piezoelectric element 116 and a temperature-compensating layer 115 located between electrode 114 and piezoelectric element 116. Additionally, in FBAR 150, temperature-compensating element 109 is composed of a temperature-compensating layer 153 located between electrode 152 and piezoelectric element 156 and a temperature-compensating layer 155 located between electrode 154 and piezoelectric element 156. Finally, in FBAR 170 (FIG. 3C), temperature-compensating element 109 is composed of a temperature-compensating layer 173 located between electrode 172 and 176 piezoelectric element and a temperature-compensating layer 175 located between electrode 174 and piezoelectric element 176.

The above-mentioned temperature-compensating layers are each a layer of a temperature-compensating material having a temperature coefficient opposite in sign to the temperature coefficients of the piezoelectric element 116 and the electrodes 112 and 114 of FBAR 110, piezoelectric element 156 and the electrodes 152 and 154 of FBAR 150, and piezoelectric element 176 and the electrodes 172 and 174 of FBAR 170. In the example shown, the temperature-compensating material is silicon dioxide $SiO_2$. In other embodiments, either or both of the temperature-compensating material and another of the materials from which FBAR stack 321 is fabricated is incompatible with the release etchant used as described above to remove sacrificial material 105 from cavity 104 after FBAR stack 321 has been fabricated.

As used in this disclosure, the temperature coefficient of a component of FBAR stack 321, e.g., temperature-compensating element 109, temperature-compensating layers 113, 115, 153, 155, 173 and 175, piezoelectric elements 116, 156 and 176 and electrodes 112, 114, 152, 154, 172 and 174 is the temperature coefficient of a parameter of the component on which the temperature coefficient of the resonant frequencies of FBARs 110, 150 and 170 depend. Typically, the parameter is a combination of the propagation velocity of sound in the component and the coefficient of thermal expansion of the component. The parameter may additionally take account of the acoustic impedance of the component.

In the example shown, temperature-compensating layers 113 and 115 constituting temperature-compensating element 109 have substantially the same shape and size as the electrodes adjacent which they are located in a plane parallel to the major surfaces of the layers. For example, in FBAR 110, temperature-compensating layer 113 is the same shape and size as adjacent electrode 112. Also in the example shown, in FBAR 110, for example, temperature-compensating layers 113 and 115 are juxtaposed with electrodes 112 and 114, respectively, and are located between electrode 112 and piezoelectric element 116 and between electrode 114 and piezoelectric element 116, respectively. Alternatively, temperature-compensating layers 113 and 115 are substantially the same shape and size as piezoelectric element 116. FBARs 150 and 170 are similar.

Variations in the structure of FBAR device from that exemplified in FIGS. 3A and 3B will now be described. For the sake of brevity, only variations in the structure of FBAR 110 will be described on the understanding that similar variations can be applied to the structures of FBARs 150 and 170. The variations described next may additionally be applied to the other suspended FBAR devices described herein.

In a first variation, temperature-compensating layers 113 and 115 are respectively located on the opposite sides of electrode 112 and electrode 114 from piezoelectric element 116. In this arrangement, to obtain a given temperature compensation effect, the temperature-compensating layers are substantially thicker than the temperature-compensating layers in the embodiment shown in FIG. 3B. The thickness multiplier is typically in the range of four to eight. However, temperature-compensating layers located on the opposite sides of the electrodes from the piezoelectric element are removed from the electric field generated between the electrodes. This eliminates the impairment of the coupling constant that results from locating insulating temperature-compensating layers in the electric field. The coupling constant characterizes the electromagnetic coupling between the electric field and the piezoelectric element. As a further alternative, temperature-compensating layers may be located on both sides of the electrodes. These variations are shown in above-mentioned U.S. patent application Ser. No. 10/977, 398.

In another variation, temperature-compensating element 109 is composed of only a single temperature-compensating layer 113. Single temperature-compensating layer 113 has a thickness equal to the sum of the thicknesses of temperature-compensating layers 113 and 115 in the embodiment shown in FIG. 3B. Single temperature-compensating layer 113 is juxtaposed with electrode 112 and is located between electrode 112 and piezoelectric element 116. Single temperature-compensating layer 113 may alternatively be located on the opposite side of electrode 112 from piezoelectric element 116. A single temperature-compensating element may alternatively be juxtaposed with electrode 114 in any of the ways just described with respect to electrode 112.

In variations in which a single temperature-compensating layer is used, the thickness of the electrode not juxtaposed with the temperature-compensating layer may be increased to restore the symmetry of the respective FBAR. However, increasing the thickness of the electrode increases the temperature coefficient that needs to be compensated by the temperature-compensating element. Device asymmetry decreases the coupling constant, but such decreased coupling constant is typically acceptable.

In another variation, temperature-compensating element 109 is composed of single temperature-compensating layer 113 embedded in piezoelectric element 116. This locates temperature-compensating layer 113 part-way through, e.g., half-way through, the thickness of piezoelectric element 116 and provides a symmetrical FBAR having a single temperature-compensating layer.

Temperature-compensating element 109 typically provides more effective temperature compensation in embodiments in which it is located between electrodes 112 and 114 than in embodiments in which it located elsewhere.

In the above-described embodiments, temperature-compensating element 109 reduces the temperature coefficient of the resonant frequencies of FBARs 110, 150 and 170. The positive temperature coefficient of the propagation velocity of the temperature-compensating element offsets at least in part the negative temperature coefficient of the propagation velocity of the piezoelectric element and the electrodes. In some embodiments, the thickness of the temperature-compensating element is set such that the effective temperature coefficient of the resonant frequency of each FBAR is zero. In other embodiments, the thickness of the temperature-compensating element is set such that the effective temperature coefficient of the resonant frequency of each FBAR remains negative, but is substantially less than that of a conventional FBAR device in which the FBAR stack has no temperature-compensating element. A reduction in the temperature coefficient of the resonant frequencies of the FBARs will increase either or both of the operating temperature range and the manufacturing yield of suspended FBAR device 300. A useful increase in manufacturing yield is obtained simply by reducing the temperature coefficient of the resonant frequency of each FBAR to one half of that of a conventional FBAR.

Elements described in this disclosure as being juxtaposed typically physically contact one another as shown in FIG. 3B. However, juxtaposed elements may be separated by intervening elements provided such intervening elements have a negligible effect on the acoustical properties of the juxtaposed elements.

Figure 4A:
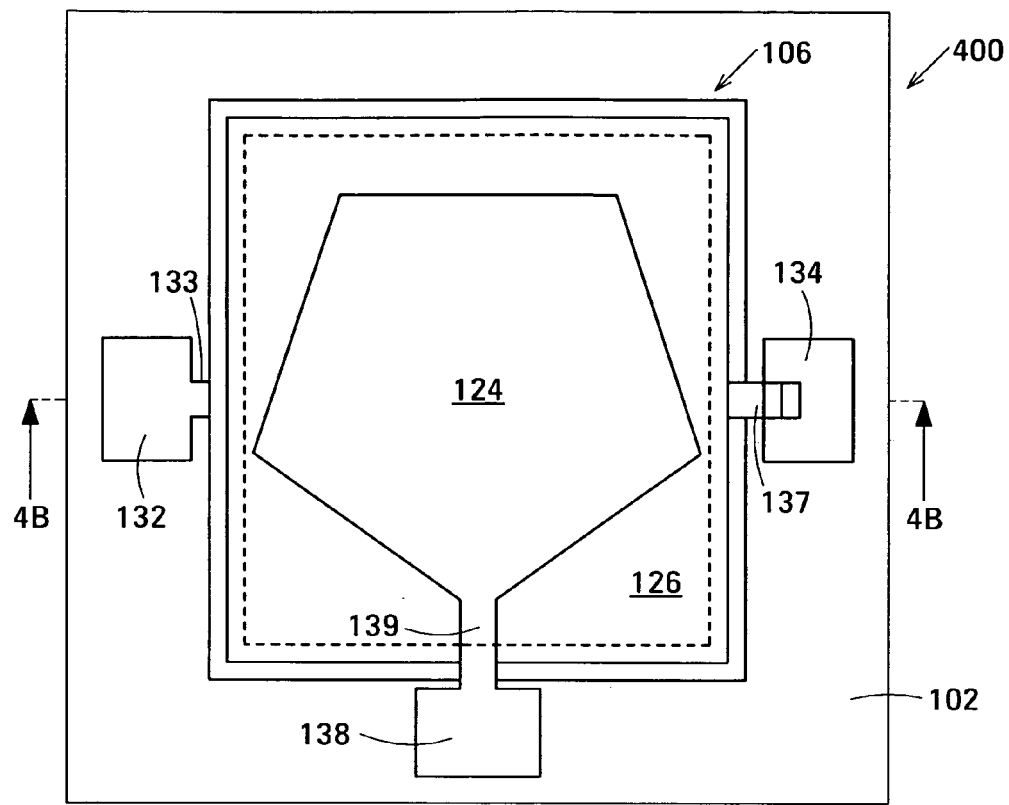
FIG. 4A is a plan view of a third embodiment of a suspended device in accordance with the invention.
Figure 4B:
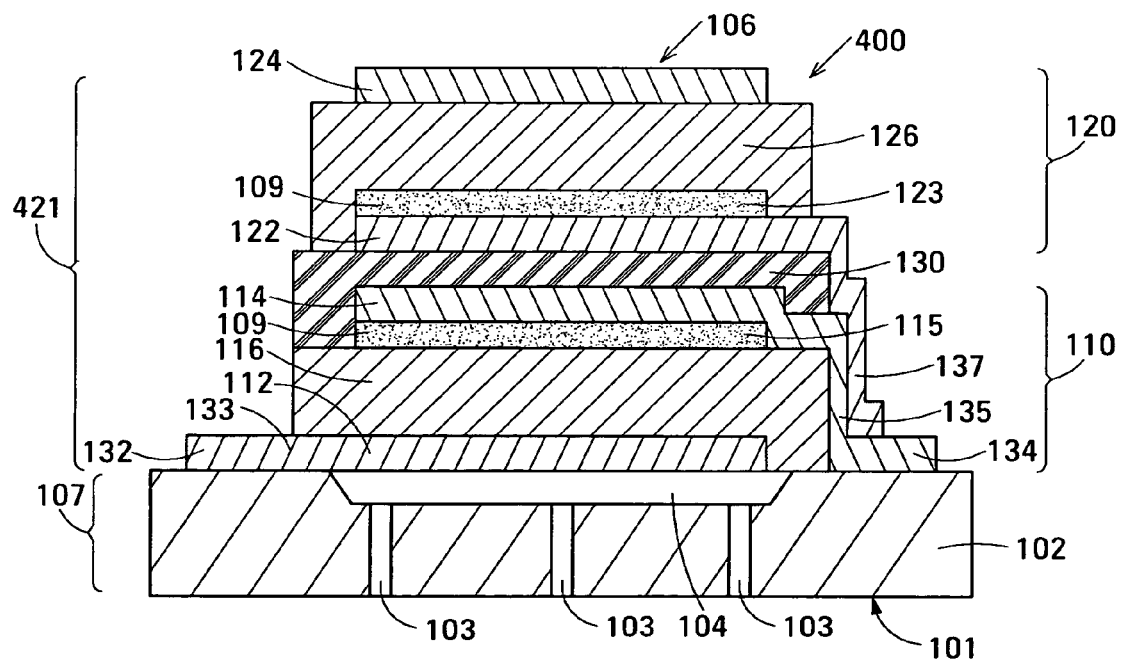
FIG. 4B is a cross-sectional view along section line 4B-4B in FIG. 4A.

FIGS. 4A and 4B are respectively a plan view and a cross-sectional view of a third embodiment of a suspended device in accordance with the invention. This embodiment of the suspended device is exemplified as a suspended FBAR device 400 in which a band-pass filter composed of a single decoupled stacked bulk acoustic resonator (DSBAR) 106 is defined in an FBAR stack 421. DSBAR 106 is composed of two temperature-compensated FBARs 110 and 120 and an acoustic decoupler 130 between the FBARs. FBAR stack 421 is suspended over cavity 104 defined in substrate 102. Etchant access holes 103 extend from the back side 101 of substrate 102 to cavity 104. Cavity 104 and etchant access holes 103 can be regarded as being a first portion and a second portion, respectively, of cavity 107.

In suspended FBAR device 400, FBAR stack 421 is composed of DSBAR 106 and temperature-compensating element 109. DSBAR 106 is composed of above-described FBAR 110 as a lower FBAR, an upper FBAR 120 stacked on lower FBAR 110, and an acoustic decoupler 130 between the FBARs.

Lower FBAR 110 has opposed planar electrodes 112 and 114 and a piezoelectric element 116 between the electrodes. Piezoelectric element 116 has a temperature coefficient on which the temperature coefficient of the resonant frequency of FBAR 110 depends at least in part. The temperature coefficient of the resonant frequency of FBAR 110 typically additionally depends on the temperature coefficient of electrodes 112 and 114. Upper FBAR 120 has opposed planar electrodes 122 and 124 and a piezoelectric element 126 between the electrodes. Piezoelectric element 126 has a temperature coefficient on which the temperature coefficient of the resonant frequency of FBAR 120 depends at least in part. The temperature coefficient of the resonant frequency of FBAR 120 typically additionally depends on the temperature coefficient of electrodes 122 and 124. Temperature-compensating element 109 has a temperature coefficient opposite in sign to the temperature coefficient of piezoelectric elements 116 and 126.

As a result of the opposite sign of its temperature coefficient, temperature-compensating element 109 reduces the effect of the temperature coefficient of piezoelectric element 116 and typically additionally the effect of the temperature coefficient of electrodes 112 and 114 on the temperature coefficient of the resonant frequency of FBAR 110. Additionally, temperature-compensating element 109 reduces the effect of the temperature coefficient of piezoelectric element 126, and typically additionally the effect of the temperature coefficient of electrodes 122 and 124, on the temperature coefficient of the resonant frequency of FBAR 120. The reduced temperature coefficients of the resonant frequencies of the FBARs 110 and 120 reduce the temperature coefficient of the pass bandwidth of suspended FBAR device 400. As a result, the temperature coefficient of the pass bandwidth of suspended FBAR device 400 is less than that of a similar FBAR device without a temperature-compensating element.

In the example shown in FIG. 4B, temperature-compensating element 109 is composed of temperature-compensating layer 115 located in FBAR 110 between electrode 114 and piezoelectric element 116 and a temperature-compensating layer 123 located in FBAR 120 between electrode 122 and piezoelectric element 126. Temperature-compensating layers 115 and 123 are each a layer of the above-described temperature-compensating material having a temperature coefficient opposite in sign to the temperature coefficients of piezoelectric elements 116 and 126. In a typical embodiment of FBAR device 400, piezoelectric elements 116 and 126 each have a negative temperature coefficient and the temperature-compensating material has a positive temperature coefficient. In the example shown, the temperature-compensating material is silicon dioxide $SiO_2$. In other embodiments, either or both of the temperature-compensating material and another of the materials from which FBAR stack 421 is fabricated is incompatible with the release etch used as described above to remove sacrificial material 105 from cavity 104 after FBAR stack 421 has been fabricated.

In FBAR device 400, acoustic decoupler 130 is located between FBARs 110 and 120, specifically, between electrode 114 of FBAR 110 and electrode 122 of FBAR 120. The acoustic decoupler controls the coupling of acoustic energy between FBARs 110 and 120. The acoustic decoupler couples less acoustic energy between the FBARs than would be coupled by direct contact between the FBARs as they would be in a conventional stacked bulk acoustic resonator (SBAR). The coupling of acoustic energy defined by acoustic decoupler 130 determines the pass bandwidth of FBAR device 400. In the example shown in FIG. 4B, acoustic decoupler 130 is composed of an acoustic decoupling layer of acoustic decoupling material.

In the example shown, FBAR stack 411 is suspended over cavity 104 defined in substrate 102. Cavity 104 acoustically isolates FBAR stack 411 from substrate 102. The acoustic isolation between FBAR stack 411 and substrate 102 allows the FBARs 110 and 120 constituting DSBAR 106 to resonate mechanically in response to an input electrical signal applied between the electrodes of one of them. The acoustic energy generated in the FBAR that receives the input electrical signal passes through acoustic decoupler 130 into the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts arising from undesirable acoustic coupling between FBAR stack 411 and substrate 102.

In the example shown, the electrodes 112 and 114 of FBAR 110 are electrically connected to terminal pads 132 and 134, respectively, by electrical traces 133 and 135, respectively. Additionally, the electrodes 122 and 124 of FBAR 120 are electrically connected to terminal pads 134 and 138, respectively, by electrical traces 137 and 139. In an embodiment that provides galvanic isolation between input and output, electrical trace 137 is connected to an additional terminal pad (not shown) instead of to terminal pad 134. Terminal pads 132, 134 and 138 are used to make electrical connections from FBAR device 400 to external electrical circuits (not shown).

In the example shown, acoustic decoupler 130 is composed of a quarter-wave layer of acoustic decoupling material. The acoustic impedance of the acoustic decoupling material is less that of the materials of FBARs 110 and 120 and is substantially greater than that of air. The acoustic impedance of a material is the ratio of stress to particle velocity in the material and is measured in Rayleighs, abbreviated as rayl. The acoustic impedances of the materials of the FBARs are typically greater than 30 Mrayl (35 Mrayl for AlN and 63 Mrayl for Mo) and the acoustic impedance of air is about 1 krayl. In embodiments of FBAR device 400 in which the materials of FBARs 110, 120 are as stated above, acoustic decoupling materials with an acoustic impedance in the range from about 2 Mrayl to about 8 Mrayl work well as the acoustic coupling material of acoustic decoupler 130.

A quarter-wave layer has a nominal thickness t equal to an odd integral multiple of one quarter of the wavelength $\lambda_n$ in the acoustic decoupling material of an acoustic signal equal in frequency to the center frequency of the pass band of FBAR device 400, i.e., $t \approx (2m+1)\lambda_n/4$, where t and $\lambda_n$ are as defined above and m is an integer equal to or greater than zero. In an embodiment, the value of integer m is zero, i.e., $t \approx \lambda_n/4$. The frequency response of an embodiment of FBAR device 400 having an acoustic decoupler in which the value of integer m is zero is less likely to exhibit spurious artifacts than an embodiment having an acoustic decoupler in which the value of integer m is greater than zero. The frequency response the latter embodiment in which the value of integer m is greater than zero is more likely to exhibit spurious artifacts due to the ability of the thicker acoustic decoupler to support multiple acoustic modes.

Embodiments of acoustic decoupler 130 that differ in thickness from the nominal quarter-wave thickness by approximately ±10% of $\lambda_n/4$ can alternatively be used. A thickness tolerance outside this range can be used with some degradation in performance. However, acoustic decoupler 130 should differ significantly in thickness from an integral multiple of $\lambda_n/2$.

Many plastic materials have acoustic impedances in the above-described range from about 2 Mrayl to about 8 Mrayl and can be applied in layers of uniform thickness in the thickness ranges stated above. Such plastic materials are therefore potentially suitable for use as the acoustic decoupling material of acoustic decoupler 130. However, the acoustic decoupling material must also be capable of withstanding the temperatures of the fabrication operations performed after acoustic decoupler 130 has been fabricated. As will be described in more detail below, in practical embodiments of FBAR device 400, electrodes 122 and 124 and piezoelectric layer 126 are deposited by sputtering after acoustic decoupler 130 has been fabricated. Temperatures as high as 400° C. are reached during these deposition processes. Thus, a plastic that remains stable at such temperatures is used as the acoustic decoupling material.

Plastic materials typically have a very high acoustic attenuation per unit length compared with the other materials of FBARs 110 and 120. However, since the plastic acoustic decoupler 130 is typically less than 1 µm thick, e.g., 200 nm thick, the acoustic attenuation introduced by such embodiment of acoustic decoupler 130 is typically negligible.

In one embodiment, a polyimide is used as the acoustic decoupling material of acoustic decoupler 130. Polyimide is sold under the trademark Kapton® by E. I. du Pont de Nemours and Company. In such embodiment, acoustic decoupler 130 is composed of a quarter-wave layer of polyimide applied to electrode 114 by spin coating. Polyimide has an acoustic impedance of about 4 Mrayl.

In another embodiment, a poly(para-xylylene) is used as the acoustic decoupling material of acoustic decoupler 130. In such embodiment, acoustic decoupler 130 is composed of a quarter-wave layer of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, a crosslinked polyphenylene polymer is used as the acoustic decoupling material of acoustic decoupler 130. In such embodiment, acoustic decoupler 130 is a quarter-wave layer of a crosslinked polyphenylene polymer applied by spin coating. Crosslinked polyphenylene polymers have been developed as low dielectric constant dielectric materials for use in integrated circuits and consequently remain stable at the high temperatures to which acoustic decoupler 130 is subject during the subsequent fabrication of FBAR 120. The inventors have discovered that crosslinked polyphenylene polymers additionally have a calculated acoustic impedance of about 2 Mrayl. This acoustic impedance is in the range of acoustic impedances that provides FBAR device 400 with a useful pass bandwidth.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SILK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the*

*Fabrication of Integrated Circuit Interconnect,* 12 ADVANCED MATERIALS, 1769 (2000), also incorporated by reference. Compared with polyimide, crosslinked polyphenylene polymers are lower in acoustic impedance, lower in acoustic attenuation and lower in dielectric constant. Moreover, a spun-on layer of the precursor solution is capable of producing a high-quality film of the crosslinked polyphenylene polymer with a thickness of the order of 200 nm, which is a typical thickness of acoustic decoupler 130 in FBAR devices operating at about 2 GHz.

In an alternative embodiment, acoustic decoupler 130 is composed of acoustic decoupling layers (not shown) of acoustic decoupling materials having different acoustic impedances as described in U.S. patent application Ser. No. 10/965,449 of Larson III et al. The acoustic impedances and thicknesses of the acoustic decoupling layers collectively define the acoustic impedance of acoustic decoupler 130. The acoustic impedance of acoustic decoupler 130 in turn defines the pass bandwidth of FBAR device 400. The embodiment of acoustic decoupler 130 composed of acoustic decoupling layers of acoustic decoupling materials having different acoustic impedances is structured to impose a nominal phase change of an odd integral multiple of $\pi/2$ radians on an acoustic signal equal in frequency to the center frequency of the pass band of FBAR device 400. In an embodiment, the acoustic decoupler is structured to impose a nominal phase change of $\pi/2$ radians on an acoustic signal equal in frequency to the center frequency. This phase change is equal to the nominal phase change imposed by an acoustic decoupler composed of a single layer of acoustic decoupling material having a nominal thickness equal to one quarter of the wavelength in the acoustic decoupling material of an acoustic signal equal in frequency to the center frequency.

In an example, acoustic decoupler 130 was composed of an acoustic decoupling layer of a crosslinked polyphenylene polymer having an acoustic impedance of about 2 Mrayl atop an acoustic decoupling layer of polyimide having an acoustic impedance of about 4 Mrayl. Such acoustic decoupler provides an embodiment of FBAR device 400 with a pass bandwidth intermediate between the pass bandwidths of embodiments in which the acoustic decouplers are composed of single quarter-wave layer of polyimide or single quarter-wave layer of the crosslinked polyphenylene polymer.

In an alternative embodiment, the acoustic impedance of the acoustic decoupling material of acoustic decoupler 130 is substantially greater than that of the materials of FBARs 110 and 120. No acoustic decoupling materials having this property are known at this time, but such materials may become available in future. Alternatively, FBAR materials with lower acoustic impedances may become available in future. The thickness of acoustic decoupler 130 of such high acoustic impedance acoustic decoupling material is as described above.

In another embodiment (not shown), acoustic decoupler 130 is structured as a Bragg structure composed of a low acoustic impedance Bragg element sandwiched between high acoustic impedance Bragg elements. The low acoustic impedance Bragg element is a layer of a low acoustic impedance material whereas the high acoustic impedance Bragg elements are each a layer of high acoustic impedance material. The acoustic impedances of the Bragg elements are characterized as "low" and "high" with respect to one another and additionally with respect to the acoustic impedance of the piezoelectric material of piezoelectric elements 116 and 126. At least one of the Bragg elements additionally has a high electrical resistivity and a low dielectric permittivity to provide electrical isolation between input and output of FBAR device 400.

Each of the layers constituting the Bragg element is nominally a quarter-wave layer. Layers that differ from the nominal quarter-wave thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, the low acoustic impedance Bragg element is a layer of silicon dioxide ($SiO_2$), which has an acoustic impedance of about 13 Mrayl, and each of the high acoustic impedance Bragg elements is a layer of the same material as electrodes 114 and 122, e.g., molybdenum, which has an acoustic impedance of about 63 Mrayl. Using the same material for the high acoustic impedance Bragg elements and the electrodes of FBARs 110 and 120 allows the high acoustic impedance Bragg elements additionally to serve as the electrodes of the FBARs adjacent the acoustic coupling elements. In this embodiment, the low acoustic impedance Bragg element is additionally incompatible with the release etchant.

A stacked bulk acoustic resonator (SBAR) may be defined in an embodiment of FBAR stack 421 from which acoustic decoupling layer 131 is omitted. Electrodes 114 and 154 or electrodes 122 and 162 may additionally be omitted.

Figure 5A:
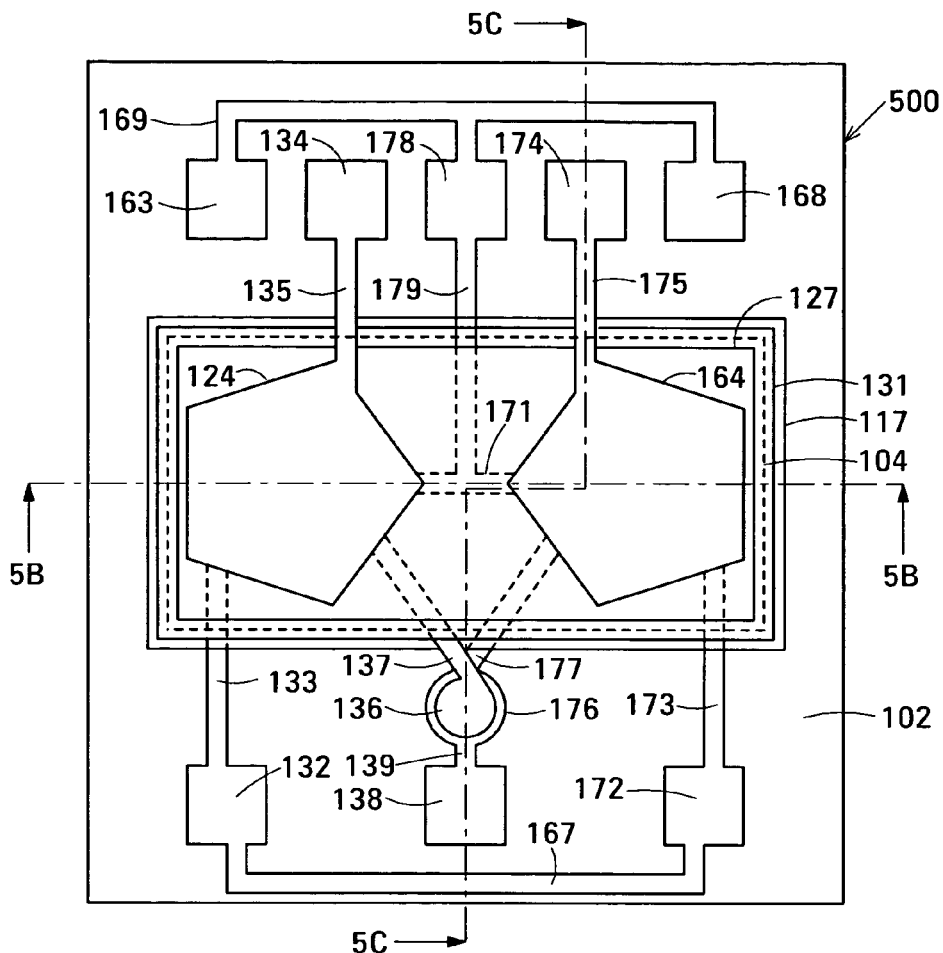
FIG. 5A is a plan view of a fourth embodiment of a suspended device in accordance with the invention.
Figure 5B:
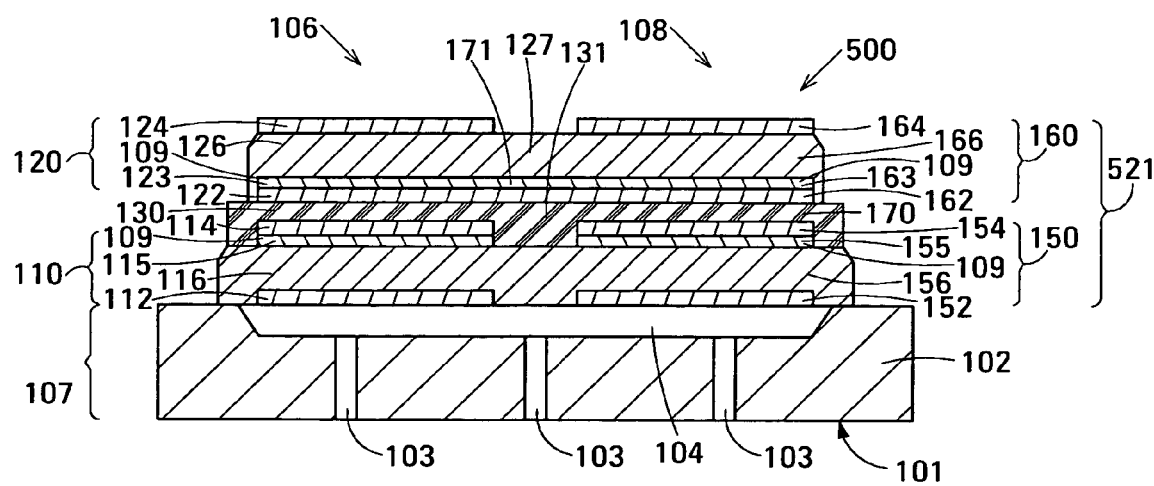
FIGS. 5B and 5C are cross-sectional views along section lines 5B-5B and 5C-5C, respectively, in FIG. 5A.
Figure 5C:
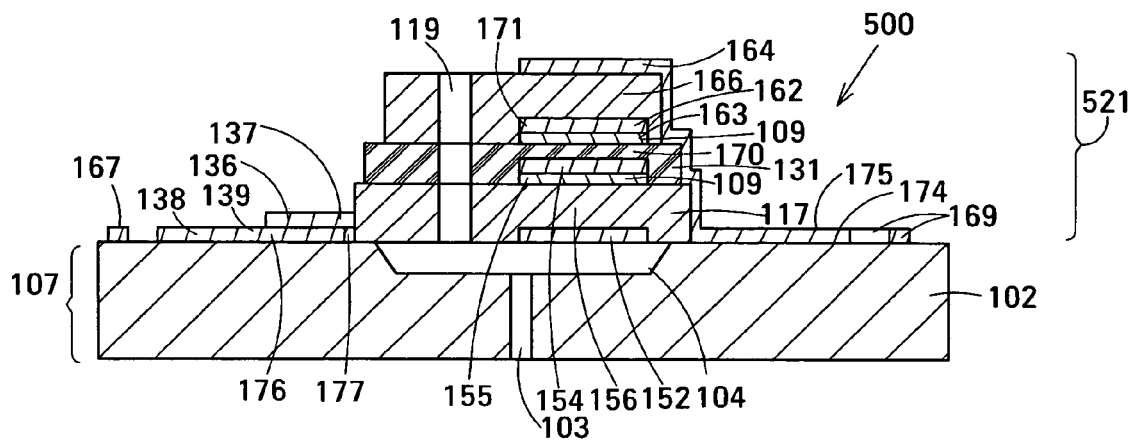
Figure 5D:
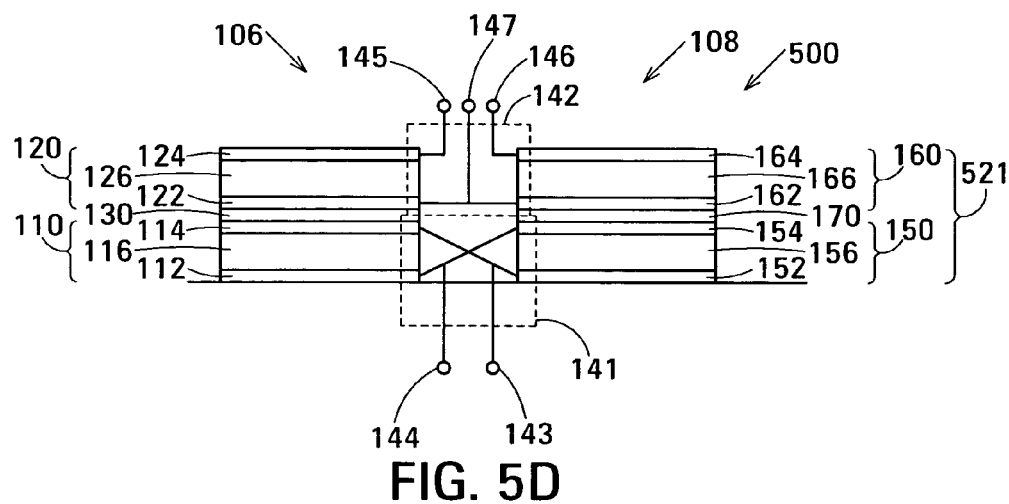
FIG. 5D is a schematic drawing showing the electrical connections in the embodiment of the suspended device shown in FIG. 5A.

FIG. 5A is a plan view of a fourth embodiment of a suspended device in accordance with the invention. This embodiment of the suspended device is exemplified as a suspended FBAR device 500 in which a film acoustically-coupled transformer (FACT) composed of two electrically-interconnected decoupled stacked bulk acoustic resonators (DSBARs) 106 and 108 is defined in an FBAR 521. FIGS. 5B and 5C are cross-sectional views along the section lines 5B-5B and 5C-5C, respectively, in FIG. 5A. FIG. 5D is a schematic drawing of the electrical circuits of the example of the FACT shown in FIG. 5A and described below.

FBAR stack 521 is suspended over cavity 104 defined in substrate 102. Etchant access holes 103 extend from the back side 101 of substrate 102 to cavity 104. Cavity 104 and etchant access holes 103 can be regarded as being a first portion and a second portion, respectively, of cavity 107. Alternatively, DSBARs 106 and 108 may be individually suspended over respective cavities 104. In this case, etchant access holes 103 extend from the back side 101 of substrate 102 to each cavity 104.

In suspended FBAR device 500, FBAR stack 521 comprises DSBAR 106, described above, and temperature-compensating element 109. DSBAR 106 constitutes a first DSBAR of FBAR stack 521, and comprises FBAR 110, which is a lower FBAR in DSBAR 106. DSBAR 106 additionally comprises upper FBAR 120 stacked on lower FBAR 110 and acoustic decoupler 130 between FBARs 110 and 120. FBAR stack 521 additionally comprises a second DSBAR 108 composed of a lower FBAR 150, an upper FBAR 160 stacked on lower FBAR 150 and an acoustic decoupler 170 between FBARs 150 and 160.

FBAR device 500 is additionally composed of an electrical circuit that interconnects the lower FBARs 110 and 150 of DSBARs 106 and 108, respectively, and an electrical circuit that interconnects the upper FBARs 120 and 160 of DSBARs 106 and 108, respectively. FIG. 5D shows an example in which an electrical circuit 141 connects the lower FBAR 110 of DSBAR 106 and the lower FBAR 150 of DSBAR 108 in anti-parallel, and an electrical circuit 142 connects the upper FBAR 120 of DSBAR 106 and the upper FBAR 160 of DSBAR 108 in series.

In DSBAR 106, lower FBAR 110 is composed of opposed planar electrodes 112 and 114 and a piezoelectric element 116 between the electrodes. Piezoelectric element 116 has a temperature coefficient on which the temperature coefficient of the resonant frequency of FBAR 110 depends at least in part. The temperature coefficient of the resonant frequency of FBAR 110 typically additionally depends on the temperature coefficient of electrodes 112 and 114. Upper FBAR 120 is composed of opposed planar electrodes 122 and 124 and a piezoelectric element 126 between the electrodes. Upper FBAR 120 has opposed planar electrodes 122 and 124 and a piezoelectric element 126 between the electrodes. Piezoelectric element 126 has a temperature coefficient on which the temperature coefficient of the resonant frequency of FBAR 120 depends at least in part. The temperature coefficient of the resonant frequency of FBAR 120 typically additionally depends on the temperature coefficient of electrodes 122 and 124. Temperature-compensating element 109 has a temperature coefficient opposite in sign to the temperature coefficient of piezoelectric elements 116 and 126.

In DSBAR 108, lower FBAR 150 is composed of opposed planar electrodes 152 and 154 and a piezoelectric element 156 between the electrodes. Piezoelectric element 156 has a temperature coefficient on which the temperature coefficient of the resonant frequency of FBAR 150 depends at least in part. The temperature coefficient of the resonant frequency of FBAR 150 typically additionally depends on the temperature coefficient of electrodes 152 and 154. Upper FBAR 160 is composed of opposed planar electrodes 162 and 164 and a piezoelectric element 166 between the electrodes. Piezoelectric element 166 has a temperature coefficient on which the temperature coefficient of the resonant frequency of FBAR 160 depends at least in part. The temperature coefficient of the resonant frequency of FBAR 160 typically additionally depends on the temperature coefficient of electrodes 162 and 164. Temperature-compensating element 109 has a temperature coefficient opposite in sign to the temperature coefficient of piezoelectric elements 156 and 166.

As a result of the opposite sign of its temperature coefficient, temperature-compensating element 109 reduces the effect of the temperature coefficient of piezoelectric elements 116, 126, 156 and 166, and typically additionally the effect of the temperature coefficient of electrodes 112, 114, 122, 124, 152, 154, 162 and 166, on the temperature coefficients of the resonant frequencies of FBARs 110, 120, 150 and 160 constituting FBAR device 500. The reduced temperature coefficients of the resonant frequencies of the FBARs 110, 120, 150 and 160 reduce the temperature coefficient of the pass bandwidth of suspended FBAR device 500. As a result, the temperature coefficient of the pass bandwidth of suspended FBAR device 500 is less than that of a similar FBAR device without a temperature-compensating element.

In the example shown in FIG. 5B, temperature-compensating element 109 is composed of temperature-compensating layer 115 located in FBAR 110 between electrode 114 and piezoelectric element 116, temperature-compensating layer 123 located in FBAR 120 between electrode 122 and piezoelectric element 126, temperature-compensating layer 155 located in FBAR 150 between electrode 154 and piezoelectric element 156 and temperature-compensating layer 163 located in FBAR 160 between electrode 162 and piezoelectric element 166. Temperature-compensating layers 115, 123, 155 and 163 are each a layer of the above-described temperature-compensating material having a temperature coefficient opposite in sign to that of piezoelectric elements 116, 126, 156 and 166. In a typical embodiment of suspended FBAR device 500, piezoelectric elements 116, 126, 156 and 166 each have a negative temperature coefficient and the temperature-compensating material has a positive temperature coefficient. In the example shown, the temperature-compensating material is silicon dioxide SiO2. In other embodiments, either or both of the temperature-compensating material and another of the materials from which FBAR stack 521 is fabricated is incompatible with the release etchant used as described above to remove sacrificial material 105 from cavity 104 after FBAR stack 521 has been fabricated.

In FBAR device 500, acoustic decoupler 130 of DSBAR 106 is located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another as they would be in a conventional stacked bulk acoustic resonator (SBAR). Additionally, acoustic decoupler 170 of DSBAR 108 is located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidth of FBAR device 500.

In the example shown in FIGS. 5A-5C, acoustic decouplers 130 and 170 are respective parts of an acoustic decoupling layer 131. In other embodiments, acoustic decouplers 130 and 170 are each composed of acoustic decoupling layers of acoustic decoupling materials having different acoustic impedances, as described above and in more detail in above-described U.S. patent application Ser. No. 10/965,449. In other embodiments, acoustic decouplers 130 and 170 are structurally independent.

FIG. 5D schematically shows an example of the electrical circuits that interconnect DSBARs 106 and 108 and connect DSBARs 106 and 108 to external electrical circuits (not shown) in suspended FBAR device 500. Electrical circuit 141 connects lower FBARs 110 and 150 in anti-parallel and to signal terminal 143 and ground terminal 144. In the embodiment of FBAR device 500 shown in FIGS. 5A-5C, terminal pad 138 provides signal terminal 143 and terminal pads 132 and 172 provide ground terminal 144. Additionally, in the embodiment, electrical circuit 141 is provided by an electrical trace 133 that extends from terminal pad 132 to electrode 112 of FBAR 110, an electrical trace 137 that extends from electrode 114 of FBAR 110 to an interconnection pad 136 in electrical contact with an interconnection pad 176, an electrical trace 139 that extends from interconnection pad 176 to signal pad 138, an electrical trace 177 that extends from interconnection pad 176 to electrode 152 of FBAR 150, an electrical trace 173 that extends from electrode 154 of FBAR 150 to terminal pad 172 and an electrical trace 167 that interconnects terminal pads 132 and 172.

In the exemplary electrical schematic shown in FIG. 5D, electrical circuit 142 connects upper FBARs 120 and 160 in series and to signal terminals 145 and 146 and to optional center-tap terminal 147. In the embodiment shown in FIGS. 5A-5C, terminal pads 134 and 174 provide signal pads 145 and 146 and terminal pad 178 provides center-tap terminal 147. Additionally, in the embodiment, electrical circuit 142 is provided by an electrical trace 135 that extends from terminal pad 134 to electrode 124 of FBAR 120, an electrical trace 171 that extends from electrode 122 of FBAR 120 to electrode 162 of FBAR 160, an electrical trace 179 that extends from trace 171 to center-tap 137, and an electrical trace 175 that extends from electrode 164 of FBAR 160 to terminal pad 174. Also shown are terminal pads 163 and 168 interconnected by an electrical trace 169 that provide local grounds for terminal pads 134 and 174. In the example shown, electrical trace 169 additionally extends to terminal pad 178. In other examples, terminal pad 178 is left floating.

The electrical connections exemplified in FIG. 5D provide a FACT with a balanced primary and a 4:1 impedance transformation ratio or a FACT with a balanced secondary and a 1:4 impedance transformation ratio. The lower FBARs may alternatively be interconnected in parallel, series, and anti-series, and the upper FBARs may alternatively be interconnected in parallel, anti-parallel and anti-series to achieve other impedance transformation ratios as shown in Table 1 below.

TABLE 1

|  | Parallel | Series | Anti-parallel. | Anti-series |
|---|---|---|---|---|
| Parallel | U 1:1 LOW | X | X | U 1:4 |
| Series | X | B 1:1 HIGH | B 4:1 | X |
| Anti-parallel. | X | B 1:4 | B 1:1 LOW | X |
| Anti-series | U 4:1 | X | X | U 1:1 HIGH |

In Table 1, the row captions indicate the configuration of electrical circuit 141, the column captions indicate the configuration of electrical circuit 142, B denotes that the FACT is electrically balanced, U denotes that the FACT is unbalanced, and X denotes a non-functioning FACT. The impedance transformation ratio shown is the impedance transformation from the configuration of electrical circuit 141 indicated by the row caption to the configuration of electrical circuit 142 indicated by the column caption. For the configurations having a 1:1 impedance transformation ratio, LOW denotes that the FACT has a low impedance, equivalent to that of two FBARs in parallel, and HIGH indicates that the FACT has a high impedance, equivalent to that of two FBARs in series.

Figure 6:
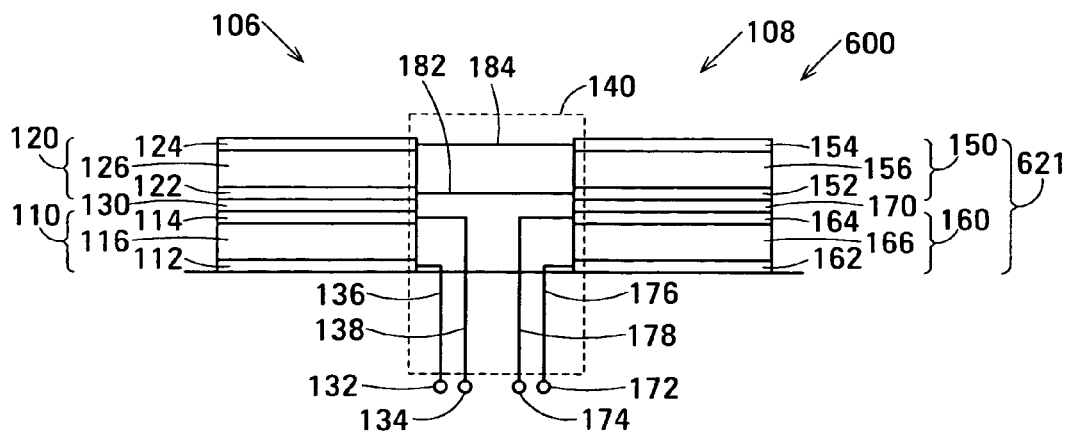
FIG. 6 is a schematic drawing showing the electrical connections in a fifth embodiment of a suspended device in accordance with the invention.

FIG. 6 is a schematic drawing showing the electrical connections of a fifth embodiment 600 of a suspended device in accordance with the invention. This embodiment of the suspended device is exemplified as a suspended FBAR device 600 a band-pass filter composed of two DSBARs 106 and 108 electrically connected in series is defined in an FBAR stack 621. DSBARs 106 and 108 are as described above with reference to FIGS. 5A-5C but are differently interconnected. The double DSBAR-based band-pass filter shown in FIG. 6 has a greater stop-band rejection than single DSBAR band-pass filter described above with reference to FIGS. 4A and 4B.

Suspended FBAR device 600 comprises FBAR stack 621, a temperature compensating element (not shown), first terminals 132 and 134, second terminals 172 and 174 and an electrical circuit 140. FBAR stack 621 is similar in structure to FBAR stack 521 described above with reference to FIGS. 5A-5C. However, in DSBAR 108, reference numeral 150 designates the upper FBAR and reference numeral 160 designates the lower FBAR.

FBAR stack 621 is suspended over a cavity (not shown) defined in a substrate (not shown) in a manner similar to FBAR stack 521. Etchant access holes extend from the back side of the substrate to the cavity in a manner similar to that described above. Alternatively, DSBARs 106 and 108 constituting FBAR stack 621 may be individually suspended over respective cavities, as described above.

Similar to FBAR stack 521, FBAR stack 621 comprises layers of temperature-compensating material (not shown) that collectively constitute a temperature-compensating element. In an example, the temperature-compensating material is silicon dioxide $SiO_2$. In other embodiments, either or both of the temperature-compensating material and another of the materials from which FBAR stack 621 is fabricated is incompatible with the release etchant used as described above to remove sacrificial material 105 from cavity 104 after FBAR stack 621 has been fabricated. FBAR stack 621 will not be further described.

In suspended FBAR device 600, electrical circuit 140 connects first DSBAR 106 and second DSBAR 108 in series between first terminals 132, 134 and second terminals 172, 174. The embodiment of FBAR device 600 shown in FIG. 6 has a 1:1 ratio between the impedance between first terminals 132, 134 and the impedance between second terminals 172, 174.

Electrical circuit 140 will now be described in further detail with reference to the example shown in FIG. 6 in which first terminals 132, 134 are designated input terminals and second terminals 172, 174 are designated output terminals. Alternatively, first terminals 132, 134 may be designated output terminals, in which case, second terminals 172, 174 are designated input terminals. Electrical circuit 140 is composed of conductors 136, 138, 176, 178, 182 and 184. Conductors 136 and 138 respectively electrically connect first terminals 132 and 134 to the electrodes 112 and 114, respectively, of the first FBAR 110 of first DSBAR 106. Conductors 182 and 184 connect DSBARs 106 and 108 in series by respectively connecting the electrode 122 of second FBAR 120 to the electrode 152 of first FBAR 150 and connecting the electrode 124 of second FBAR 120 to the electrode 154 of first FBAR 150. Conductors 176 and 178 respectively electrically connect the electrodes 162 and 164, respectively, of the second FBAR 160 of second DSBAR 108 to output terminals 172 and 174.

Further details of suspended FBAR stack 621 constituting suspended device 600 are disclosed U.S. patent application Ser. No. 11/069,409 of Larson II et al., assigned to the assignee of this disclosure and incorporated by reference. Band-pass filters composed of more than two DSBARs are also disclosed in U.S. patent application Ser. No. 11/069,409. Embodiments of such band-pass filters incorporating materials that are incompatible with the release etchant are fabricated using the process described above with reference to FIGS. 1A-1R and have the structural features described above with reference to FIGS. 3A and 3B.

As noted above, wafer-scale fabrication is used to fabricate thousands of suspended devices similar to above-described suspended devices 100, 300, 400, 500 or 600 at the same time. Such wafer-scale fabrication makes the suspended devices inexpensive to fabricate. An example of the use of the method described above with reference to FIGS. 1A-1I and 1J-1R to fabricate an embodiment of suspended FBAR device 400 described above with reference to FIGS. 4A and 4B will now be described with reference to FIGS. 1A-1I and 1J-1R, the plan views of FIGS. 7A-7J and the cross-sectional views of FIGS. 7K-7T. With different masks and/or the omission of some of the stages, the device fabrication process described below with reference to FIGS. 7A-7J and 7K-7T can also be used to fabricate embodiments of the above-described FBAR devices 100, 300, 500 and 600. The device fabrication process can also be adapted to fabricate other suspended devices.

The pass band of the embodiment of FBAR device 400 whose fabrication will be described has a nominal center frequency of about 1.9 GHz. Embodiments for operation at other frequencies are similar in structure and fabrication but have thicknesses and lateral dimensions different from those exemplified below. The example of FBAR device 400 whose fabrication will be described below has temperature-compensating element similar in structure to temperature-compensating element 109 described above with reference to FIGS. 4A and 4B. The fabrication process can be modified to fabricate temperature-compensating element 109 with other configurations as described above with reference to FIG. 3B.

As noted above, the suspended FBAR devices are fabricated on a wafer, typically of single-crystal silicon. A portion of the wafer constitutes, for each suspended FBAR device being fabricated, a substrate corresponding to the substrate 102 of FBAR device 400 (FIGS. 4A and 4B). FIGS. 7A-7J and FIGS. 7K-7T illustrate, and the following description describes, the fabrication of FBAR device 400 in and on a portion of the wafer that constitutes substrate 102. As FBAR device 400 is fabricated, the remaining FBAR devices on the wafer are similarly fabricated.

Figure 7A:
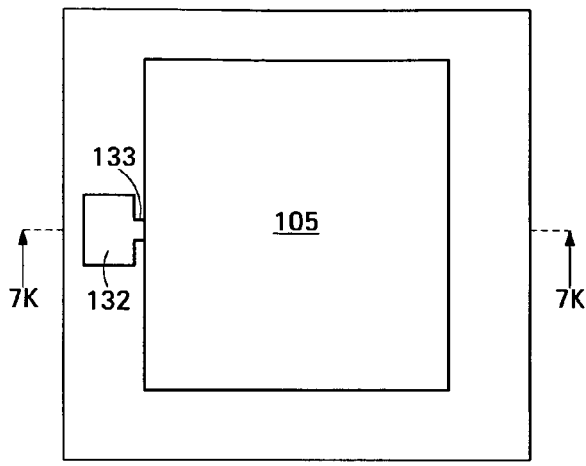
FIGS. 7A-7J are plan views illustrating an example of a process for making the embodiment shown in FIGS. 4A and 4B of a suspended device in accordance with the invention.
Figure 7K:
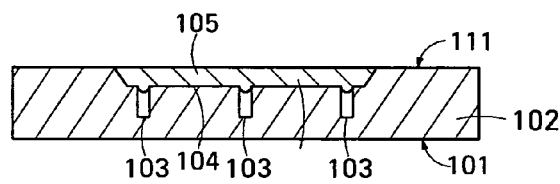
FIGS. 7K-7T are cross-sectional views along the section lines 7K-7K, 7L-7L, 7M-7M, 7N-7N, 7O-7O, 7P-7P, 7Q-7Q, 7R-7R, 7S-7S and 7T-7T in FIGS. 7A-7J, respectively.

The processes described above with reference to FIGS. 1A-1D and 1J-1M are performed leaving cavity 104 filled with sacrificial material 105 having a smooth, plane surface flush with the front side 111 of substrate 102, as shown in FIGS. 7A and 7K.

Figure 7B:
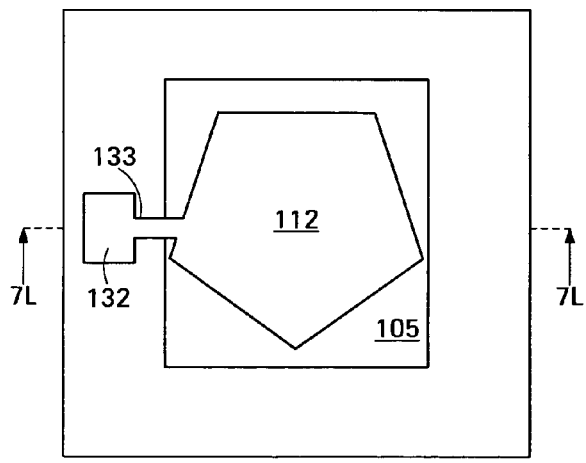
Figure 7L:
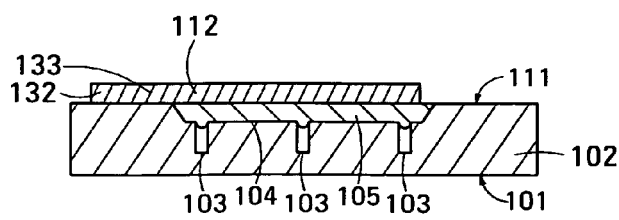

A first metal layer is deposited on the front side 111 of substrate 102 and on sacrificial material 105. The first metal layer is patterned as shown in FIGS. 7B and 7L to define electrode 112, terminal pad 132, and electrical trace 133 extending between electrode 112 and terminal pad 132. Electrode 112 is located on sacrificial material 105. Terminal pad 132 is located on substrate 102.

Electrode 112 typically has an asymmetrical shape in a plane parallel to the major surface of the wafer. An asymmetrical shape minimizes lateral modes in FBAR 110 (FIG. 4B) of which electrode 112 forms part. This is described in U.S. Pat. No. 6,215,375 of Larson III et al., assigned to the assignee of this disclosure and incorporated by reference.

Referring additionally to FIG. 4B, electrode 114 is defined in a second metal layer, electrode 122 is defined in a third metal layer and electrode 124 is defined in a fourth metal layer, as will be described in detail below. The metal layers in which the electrodes are defined are patterned such that, in respective planes parallel to the major surface of the wafer, electrodes 112 and 114 of FBAR 110 have the same shape, size, orientation and position and electrodes 122 and 124 of FBAR 120 have the same shape, size, orientation and position. Typically, electrodes 114 and 122 additionally have the same shape, size, orientation and position.

In an embodiment, the material of each of the metal layers was molybdenum deposited by sputtering to a thickness of about 300 nm. The metal layers were each patterned by dry etching. The electrodes defined in the metal layers were pentagonal each with an area of about 12,000 square µm. Other electrode areas give other characteristic impedances. Other refractory metals such as tungsten, niobium and titanium may alternatively be used as the material of the metal layers. The metal layers may each alternatively comprise layers of more than one material.

One factor to be considered in choosing the material of the electrodes of FBAR device 400 is the acoustic properties of the electrode material: the acoustic properties of the material(s) of the remaining metal parts of FBAR device are less important than other properties such as electrical conductivity. Thus, material(s) of the remaining metal parts of FBAR device 400 may be different from the material of the electrodes.

Figure 7C:
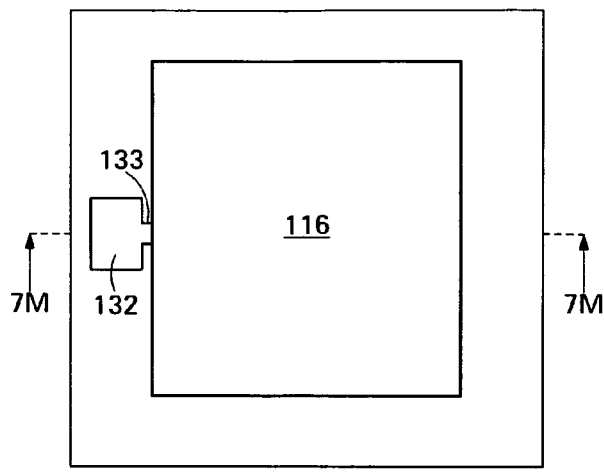
Figure 7M:
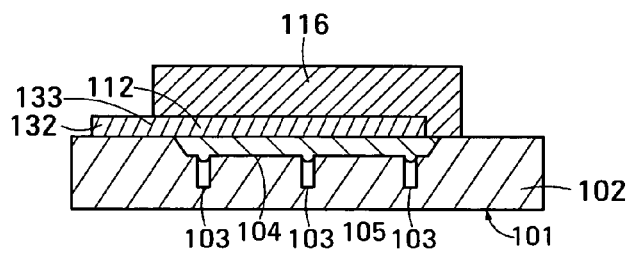

A layer of piezoelectric material is deposited and is patterned as shown in FIGS. 7C and 7M to define piezoelectric element 116. The piezoelectric layer is patterned to cover electrode 112, to cover sacrificial material 105 completely, and to extend beyond the perimeter of sacrificial material 105 onto the front side 111 of substrate 102. This configuration allows the piezoelectric layer to isolate cavity 104 (and release etchant later located therein) from the remainder of the FBAR stack. Piezoelectric layer is additionally patterned to expose terminal pad 132.

In an embodiment, the piezoelectric material deposited to form piezoelectric element 116 and piezoelectric element 126 described below was aluminum nitride and was deposited with a thickness of about 1.4 µm by sputtering. The piezoelectric material was patterned by wet etching in potassium hydroxide or by chlorine-based dry etching. Alternative materials for piezoelectric elements 116 and 126 include zinc oxide, cadmium sulfide and poled ferroelectric materials such as perovskite ferroelectric materials, including lead zirconium titanate, lead meta niobate and barium titanate.

Figure 7D:
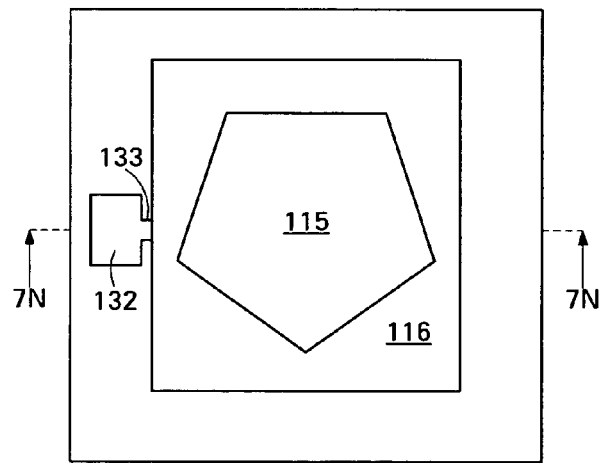
Figure 7N:
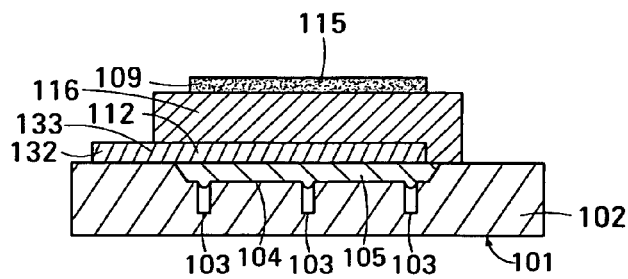

A first layer of temperature-compensating material is deposited and is patterned as shown in FIGS. 7D and 7N to define temperature-compensating layer 115, which constitutes part of temperature-compensating element 109. In the example shown, the temperature-compensating material deposited to form temperature-compensating layer 115 and that later deposited to form temperature-compensating layer 123 as described below is patterned to have the same shape, size, orientation and position as electrode 112. Alternatively, the temperature-compensating material may be patterned to have the same shape, size and position piezoelectric element 116. In a further alternative, the temperature-compensating material is patterned to have an extent intermediate between the extents of electrode 112 and piezoelectric element 116.

In an embodiment, the material of the first layer of temperature-compensating material and of the second layer of temperature-compensating material whose deposition will be described below was silicon dioxide $SiO_2$. The temperature-compensating material was deposited by chemical vapor deposition (CVD). Alternative deposition methods include sputtering and thermal evaporation. The temperature-compensating material was patterned by dry etching, typically reactive ion etching (RIE) using a mixture of sulfur hexafluoride ($SH_6$), hydrogen ($H_2$) and oxygen ($O_2$) as etchant. The layer thickness depended on the desired temperature coefficient of FBAR device 400 (FIG. 4A). In one embodiment, the thickness of the temperature compensating layers 115 and 123 was about 100 nm.

Figure 7E:
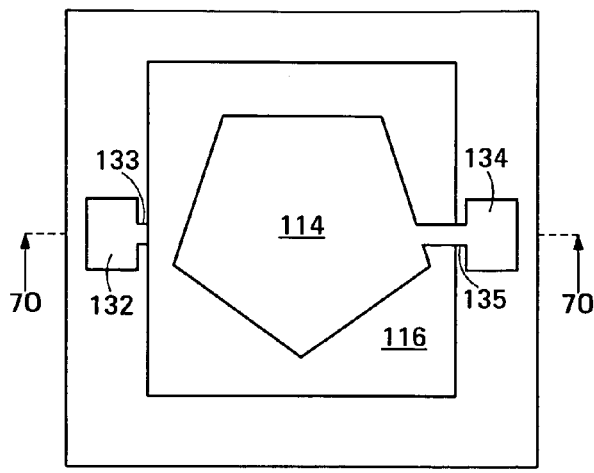
Figure 7O:
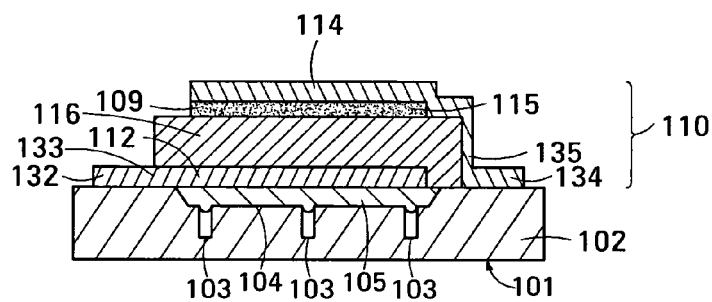

The second metal layer is deposited and is patterned to define electrode 114, terminal pad 134 and electrical trace 135 extending between electrode 114 and terminal pad 134, as shown in FIGS. 7E and 7O. This completes fabrication of FBAR 110.

Figure 7F:
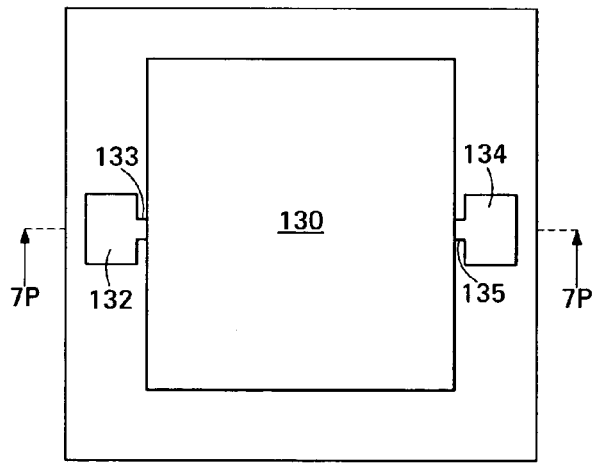
Figure 7P:
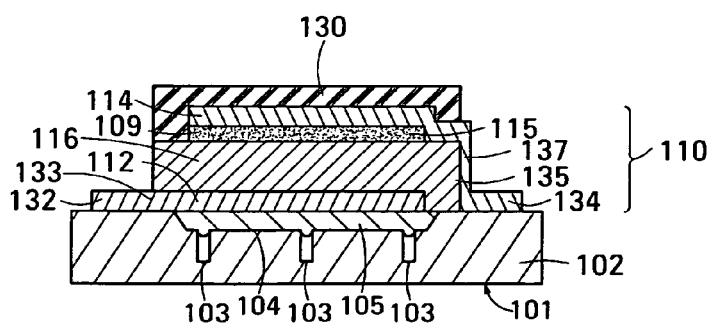

A layer of acoustic decoupling material is then deposited and is patterned to define acoustic decoupler 130, as shown in FIGS. 7F and 7P. Acoustic decoupler 130 is patterned to cover at least electrode 114, and is additionally patterned to expose terminal pads 132 and 134. Acoustic decoupler is typically a quarter-wave layer of plastic material.

In an embodiment, the acoustic decoupling material of acoustic decoupler 130 was polyimide with a thickness of about 200 nm, i.e., one quarter of the center frequency wavelength in the polyimide. The polyimide was deposited by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

Figure 7G:
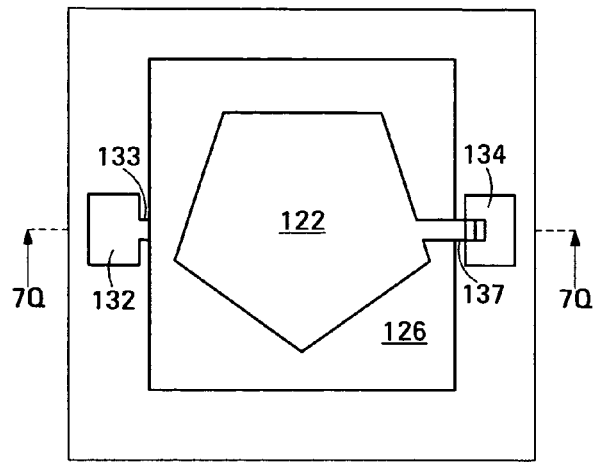
Figure 7Q:
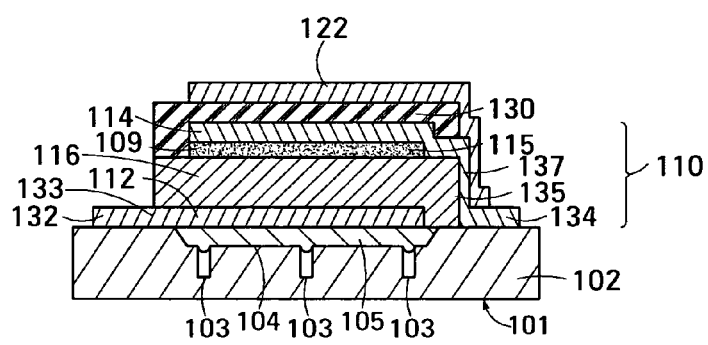

The third metal layer is deposited and is patterned to define electrode 122 and electrical trace 137 extending from electrode 122 to terminal pad 134, as shown in FIGS. 7G and 7Q. Terminal pad 134 is also electrically connected to electrode 114 by trace 135.

Figure 7H:
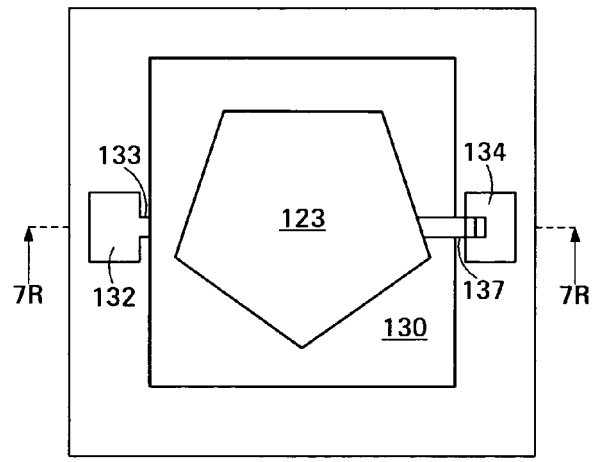
Figure 7R:
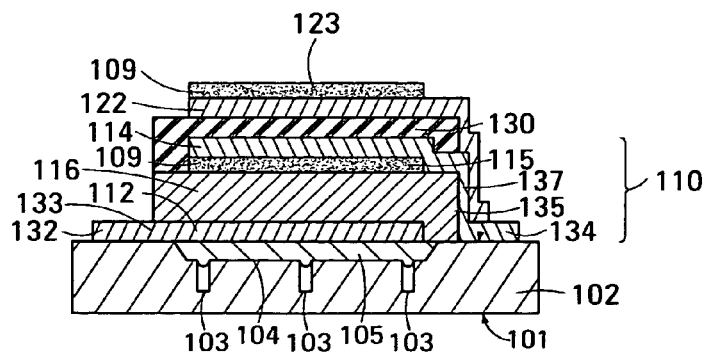

A second layer of temperature-compensating material is deposited and is patterned as shown in FIGS. 7H and 7R to define temperature-compensating layer 123, which constitutes the remainder of temperature-compensating element 109 in this embodiment. In the example shown, the temperature-compensating material is patterned as described above to have the same shape, size, orientation and position as electrode 112.

Figure 7I:
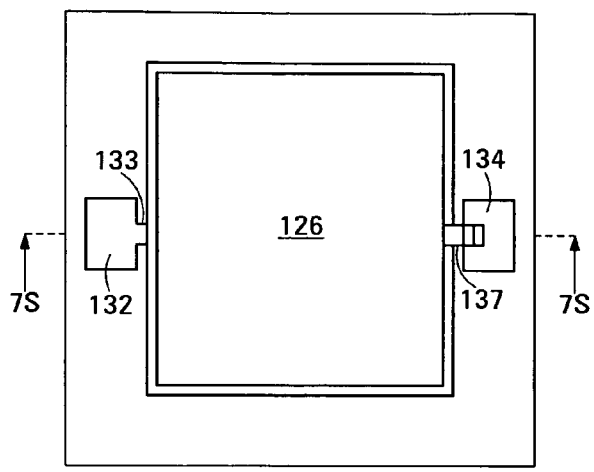
Figure 7S:
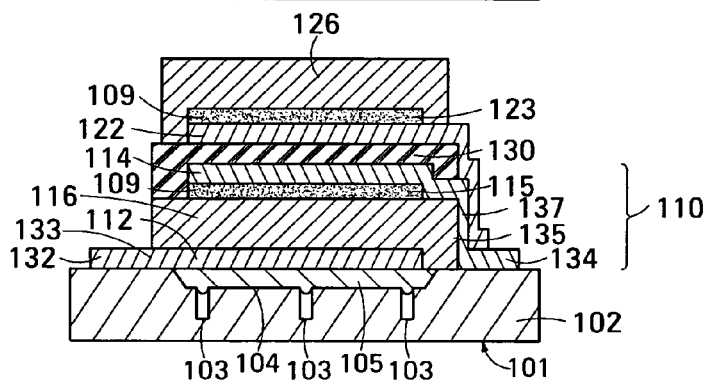

The second layer of piezoelectric material is deposited and is patterned as shown in FIGS. 7I and 7S to define piezoelectric element 126. The second piezoelectric layer is patterned to expose terminal pads 132 and 134.

Figure 7J:
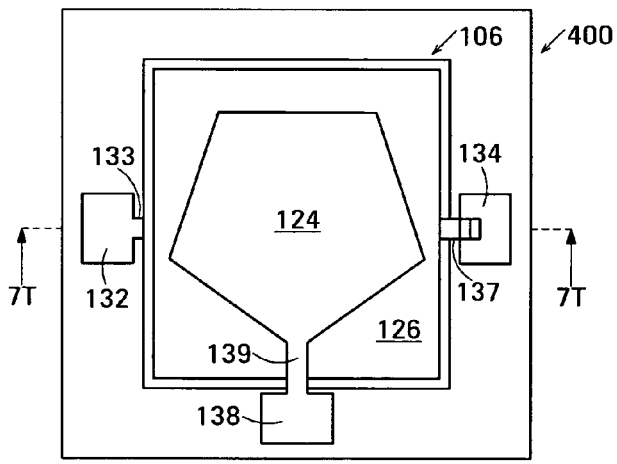
Figure 7T:
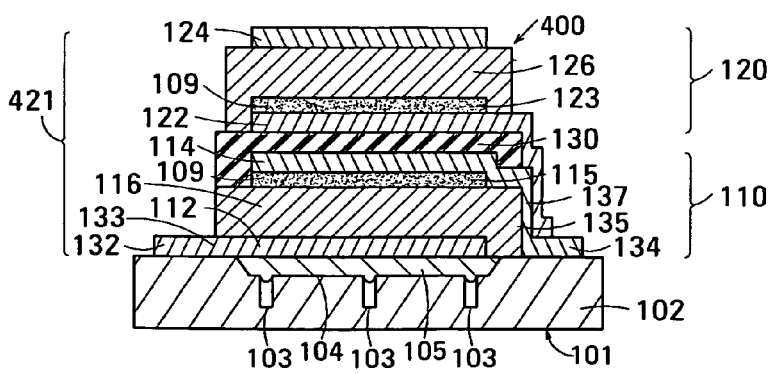

The fourth metal layer is deposited and is patterned to define electrode 124, terminal pad 138 and an electrical trace 139 extending from electrode 124 to terminal pad 138, as shown in FIGS. 7J and 7T. This completes fabrication of FBAR 120 and FBAR stack 421.

A gold protective layer (not shown) is deposited on the exposed surfaces of terminal pads 132, 134 and 138.

The processes described above with reference to FIGS. 1F-1I and 1O-1R are then performed to complete the fabrication of FBAR device 400. The processing leaves FBAR device 400 is the state shown in FIGS. 4A and 4B.

FBAR device 400 is mounted in a host electrical apparatus, such as a wireless telephone, and electrical connections are made between terminal pads 132, 134 and 138 of the FBAR device and pads that are part of the host device.

As noted above, an alternative acoustic decoupling material of acoustic decoupler 130 is a crosslinked polyphenylene polymer. After the third metal layer has been patterned to define electrode 114, as described above with reference to FIGS. 7E and 7O, the precursor solution for the crosslinked polyphenylene polymer is spun on in a manner similar to that described above with reference to FIGS. 7F and 7P, but is not patterned. The formulation of the precursor solution and the spin speed are selected so that the crosslinked polyphenylene polymer forms a layer with a thickness of about 187 nm. This corresponds to one quarter of the wavelength $\lambda_n$ in the crosslinked polyphenylene polymer of an acoustic signal having a frequency equal to the center frequency of the pass band of FBAR device 400. After depositing the layer of the precursor solution, the wafer was baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

In an embodiment, the precursor solution for the crosslinked polyphenylene polymer was one sold by The Dow Chemical Company and designated SiLK™ J. Alternatively, the precursor solution may be any suitable one of the precursor solutions now or in the future sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

The third metal layer is then deposited in a manner similar to that described above with reference to FIGS. 7G and 7Q, but is initially patterned similarly to the patterning of acoustic decoupler 130 shown in FIG. 7F to define a hard mask that will later be used to pattern the layer of the crosslinked polyphenylene polymer to define acoustic decoupler 130. The initially-patterned third metal layer has the same extent as acoustic decoupler 130 and exposes terminal pads 132 and 134.

The layer of the crosslinked polyphenylene polymer is then patterned as shown in FIG. 7F with the initially-patterned third metal layer being used as a hard etch mask. Patterning the layer of the crosslinked polyphenylene polymer defines the extent of acoustic decoupler 130, which exposes terminal pads 132 and 134 and parts of sacrificial material 105. The patterning is performed with a reactive ion etch (RIE) using an oxygen/nitrogen mixture as etchant.

The third metal layer is then re-patterned as shown in FIGS. 7G and 7Q to define electrode 122 and electrical trace 137 extending between electrode 122 and terminal pad 134.

Fabrication of the embodiment of FBAR device 400 with a layer of a crosslinked polyphenylene polymer as its acoustic decoupler is completed by performing the processing described above with reference to FIGS. 7H-7J and 7R-7T.

A similar technique similar to that just describe can be used to define acoustic decoupler 103 in a layer of parylene deposited by vacuum deposition.

The above-exemplified electrode and piezoelectric element thicknesses are thicknesses for a conventional FBAR device similar to an embodiment of FBAR 400 without temperature-compensating element 109. In an embodiment of FBAR device 400, one or more of the thicknesses are reduced to maintain the center frequency of the FBAR device notwithstanding the addition of temperature-compensating element 109 to FBAR stack 211. The identity of the one or more elements whose thicknesses are reduced and the respective thickness reductions depends on the thickness and material of temperature-compensating element 109 and the temperature compensation provided by temperature-compensating element 109. The identity of the elements and the thickness reductions additionally depends on the application in which the FBAR device will be used, as described above. Reducing the thickness of piezoelectric elements reduces the coupling constant: reducing the thickness of one or more of the electrodes increases the series resistance unless the temperature-compensating material has an electrical conductivity comparable with that of the electrodes.

This disclosure describes the invention in detail using illustrative embodiments. However, the invention defined by the appended claims is not limited to the precise embodiments described.

We claim:

1. A method of making a suspended device, the method comprising:
   providing a substrate having a front side and a back side, the substrate defining a cavity comprising a wide, shallow first portion and a narrow, deep second portion, the first portion extending into the substrate from the front side thereof and filled with sacrificial material, the second portion extending deeper into the substrate from the first portion;

fabricating a device structure over the sacrificial material; and from the back side of the substrate, introducing a release etchant via the second portion of the cavity to remove from the first portion of the cavity the sacrificial material underlying the device structure, wherein the introducing comprises:

providing access to the second portion of the cavity from the back side of the substrate; and the providing access to the second portion of the cavity comprises: reducing the substrate in thickness from the back side thereof to expose the second portion.

2. The method of claim 1, in which the second portion of the cavity extends from the back side of the substrate to the first portion of the cavity.

3. The method of claim 2, in which fabricating the device structure comprises depositing material having a low etch selectivity with respect to the sacrificial material.

4. The method of claim 1, additionally comprising, prior to the introducing, protecting the device structure from the release etchant.

5. The method of claim 1, in which the providing comprises: providing the substrate; forming the cavity in the substrate; and depositing the sacrificial material.

6. The method of claim 5, in which the second portion of the cavity extends from the back side of the substrate to the first portion of the cavity.

7. The method of claim 1, in which fabricating the device structure comprises a fabricating a film bulk acoustic resonator (FBAR) stack.

8. The method of claim 7, in which the second portion of the cavity extends from the back side of the substrate to the first portion of the cavity.

9. The method of claim 7, additionally comprising protecting the FBAR stack from the release etchant.

* * * * *